(12) United States Patent
Lin

(10) Patent No.: US 12,176,055 B2
(45) Date of Patent: Dec. 24, 2024

(54) DATA RECEIVING CIRCUIT, DATA RECEIVING SYSTEM, AND MEMORY DEVICE

(71) Applicant: CHANGXIN MEMORY TECHNOLOGIES, INC., Hefei (CN)

(72) Inventor: Feng Lin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 166 days.

(21) Appl. No.: 17/936,107

(22) Filed: Sep. 28, 2022

(65) Prior Publication Data

US 2024/0005966 A1    Jan. 4, 2024

Related U.S. Application Data

(63) Continuation of application No. PCT/CN2022/107623, filed on Jul. 25, 2022.

(30) Foreign Application Priority Data

Jul. 4, 2022 (CN) .......................... 202210787523.X

(51) Int. Cl.
*G11C 16/06* (2006.01)
*G11C 7/06* (2006.01)
(Continued)

(52) U.S. Cl.
CPC ............ *G11C 7/067* (2013.01); *G11C 7/1063* (2013.01); *G11C 7/222* (2013.01)

(58) Field of Classification Search
CPC ....... G11C 7/067; G11C 7/1063; G11C 7/222; G11C 7/1087; G11C 11/4096;
(Continued)

(56) References Cited

U.S. PATENT DOCUMENTS 6,504,778 B1   1/2003  Uekubo
8,149,953 B2   4/2012  Kim et al.
(Continued)

FOREIGN PATENT DOCUMENTS

CN   104183258 A   12/2014
CN   110649934 A    1/2020
(Continued)

OTHER PUBLICATIONS

KR Office Action cited in KR10-2022-7033426, mailed Sep. 7, 2023, 11 pages.
(Continued)

*Primary Examiner* — Tha-O H Bui
(74) *Attorney, Agent, or Firm* — Kilpatrick Townsend & Stockton LLP

(57) ABSTRACT

The data receiving circuit includes: a first amplification module configured to: receive a data signal, a first reference signal, and a second reference signal; and when an enable signal is at a first level, in response to a sampling clock signal and on a basis of a feedback signal, select the data signal and the first reference signal for first comparison and output a first signal pair, or select the data signal and the second reference signal for second comparison and output a second signal pair; and a second amplification module configured to receive output signals of the first amplification module as an input signal pair, perform amplification processing on a voltage difference of the input signal pair.

19 Claims, 5 Drawing Sheets

(51) Int. Cl.
*G11C 7/10* (2006.01)
*G11C 7/22* (2006.01)

(58) Field of Classification Search
CPC ... G11C 7/1084; G11C 7/1048; G11C 7/1078; H04L 25/0272; H04L 25/03885; H04L 25/03006
USPC .................................................... 365/185.21
See application file for complete search history.

(56) References Cited

U.S. PATENT DOCUMENTS

| | | | |
|---|---|---|---|
| 8,391,347 | B2 | 3/2013 | Kim et al. |
| 8,964,444 | B2 * | 2/2015 | Hall ................ G11C 17/16 365/96 |
| 9,515,657 | B2 | 12/2016 | Ecker et al. |
| 10,447,508 | B2 | 10/2019 | Sreeramaneni et al. |
| 10,651,829 | B2 | 5/2020 | Kim |
| 11,615,833 | B2 * | 3/2023 | Shin ............. G11C 11/4091 365/185.21 |
| 2007/0201291 | A1 | 8/2007 | Cho |
| 2008/0089155 | A1 | 4/2008 | Bae |
| 2009/0116596 | A1 | 5/2009 | Oh et al. |
| 2009/0128214 | A1 | 5/2009 | Kim et al. |
| 2012/0063242 | A1 | 3/2012 | Kim et al. |
| 2020/0274741 | A1 | 8/2020 | Kang |
| 2021/0174844 | A1 | 6/2021 | Choi et al. |
| 2021/0408970 | A1 | 12/2021 | Hong et al. |
| 2022/0068356 | A1 | 3/2022 | Shin et al. |

FOREIGN PATENT DOCUMENTS

| | | |
|---|---|---|
| CN | 112204662 A | 1/2021 |
| CN | 113852367 A | 12/2021 |
| CN | 114121062 A | 3/2022 |
| JP | 2015228540 A | 12/2015 |
| JP | 2018061164 A | 4/2018 |
| KR | 20090044055 A | 5/2009 |
| WO | 2007111035 A1 | 10/2007 |

OTHER PUBLICATIONS

International Search Report cited in PCT/CN2022/107623 mailed Nov. 30, 2022, 9 pages.
International Search Report cited in PCT/CN2022/107622 mailed Nov. 25, 2022, 9 pages.
Japanese Patent Office, Office Action Issued in Application No. 2022-556265, Sep. 3, 2024, 9 pages.

* cited by examiner

DATA RECEIVING CIRCUIT, DATA RECEIVING SYSTEM, AND MEMORY DEVICE

CROSS-REFERENCE TO RELATED APPLICATIONS

This is a continuation of International Application No. PCT/CN2022/107623, filed on Jul. 25, 2022, which claims the priority to Chinese Patent Application No. 202210787523.X, titled "DATA RECEIVING CIRCUIT, DATA RECEIVING SYSTEM, AND MEMORY DEVICE" and filed on Jul. 4, 2022. The entire contents of International Application No. PCT/CN2022/107623 and Chinese Patent Application No. 202210787523.X are incorporated herein by reference.

TECHNICAL FIELD

Embodiments of the present disclosure relate to the technical field of semiconductors, and in particular, to a data receiving circuit, a data receiving system, and a memory device.

BACKGROUND

In memory applications, as a signal transmission rate becomes increasingly fast, a channel loss has a greater impact on signal quality, which easily leads to intersymbol interference. In addition, a difference in level between a data signal received by a data receiving circuit in a memory and a reference signal affects judgment of the data receiving circuit on the data signal, thereby affecting accuracy of a signal outputted by the data receiving circuit.

At present, an equalization circuit is usually configured to compensate for a channel, and the equalization circuit may select a continuous time linear equalizer (CTLE) or a decision feedback equalizer (DFE). However, the accuracy of the signal outputted by the equalization circuit currently used needs to be improved, receiving performance of the equalization circuit needs to be enhanced, and power consumption of the equalization circuit needs to be reduced.

SUMMARY

Embodiments of the present disclosure provide a data receiving circuit, a data receiving system, and a memory device.

According to some embodiments of the present disclosure, a first aspect of the embodiments of the present disclosure provides a data receiving circuit, including: a first amplification module configured to: receive an enable signal, a feedback signal, a data signal, a first reference signal, and a second reference signal; when the enable signal is at a first level, in response to a sampling clock signal and on the basis of the feedback signal, select the data signal and the first reference signal for first comparison and output a first signal pair as a result of the first comparison, or select the data signal and the second reference signal for second comparison and output a second signal pair as a result of the second comparison; and when the enable signal is at a second level, perform the first comparison in response to the sampling clock signal, and output the first signal pair; where, the first signal pair includes a first signal and a second signal, and the second signal pair includes a third signal and a fourth signal; and a second amplification module configured to receive output signals of the first amplification module as an input signal pair, perform amplification processing on a voltage difference of the input signal pair, and output a first output signal and a second output signal as a result of the amplification processing.

According to some embodiments of the present disclosure, another aspect of the embodiments of the present disclosure also provides a data receiving system, including: a plurality of cascaded data transmission circuits, where each of the data transmission circuits includes the data receiving circuit as described above, and a latch circuit connected to the data receiving circuit; an output signal of a previous stage data transmission circuit is used as the feedback signal of a next stage data transmission circuit; and an output signal of a last stage data transmission circuit is used as the feedback signal of a first stage data transmission circuit.

According to some embodiments of the present disclosure, another aspect of the embodiments of the present disclosure also provides a memory device, including: a plurality of data ports; and a plurality of data receiving systems as described above, each of the data receiving systems corresponding to one of the data ports.

BRIEF DESCRIPTION OF THE DRAWINGS

One or more embodiments are described illustratively by use of corresponding drawings. The illustrative description does not constitute any limitation on the embodiments. Unless otherwise expressly specified, the drawings do not constitute a scale limitation. To describe the technical solutions in the embodiments of the present disclosure or in the conventional technology more clearly, the following simply describes the drawings to be used in the embodiments of the present disclosure. Evidently, the drawings outlined below are merely some embodiments of the present disclosure. A person of ordinary skill in the art may derive other drawings from the outlined drawings without making any creative effort.

DETAILED DESCRIPTION

Embodiments of the present disclosure provide a data receiving circuit, a data receiving system, and a memory device. In the data receiving circuit, the first amplification module may be further controlled using the enable signal and the feedback signal, to select whether to consider the influence of the intersymbol interference of the data received by the data receiving circuit on the data receiving circuit. For example, when the influence of the intersymbol interference on the data receiving circuit needs to be reduced, when the enable signal is at the first level, the first amplification module selects to perform the first comparison or the second comparison in response to the sampling clock signal and on the basis of the feedback signal, such that one of the outputted first signal pair and second signal pair is valid, the other one is invalid, and the signal level difference in the valid signal pair is greater, to ensure that the second amplification module receives the pair of differential signals having a greater signal level difference. When the influence of the intersymbol interference on the data receiving circuit does not need to be considered, when the enable signal is at the second level, the first amplification module only performs the first comparison in response to the sampling clock signal to regularly output the valid first signal pair, thereby achieving the effect of reducing the power consumption of the data receiving circuit while improving the receiving performance of the data receiving circuit.

The embodiments of the present disclosure are described in detail below with reference to the accompanying drawings. However, a person skilled in the art may understand that in each embodiment of the present disclosure, many technical details are proposed to help readers better understand the embodiments of the present disclosure. However, the technical solutions claimed in the embodiments of the present disclosure can still be implemented based on variations and modifications of the following embodiments even without the technical details.

Figure 1:
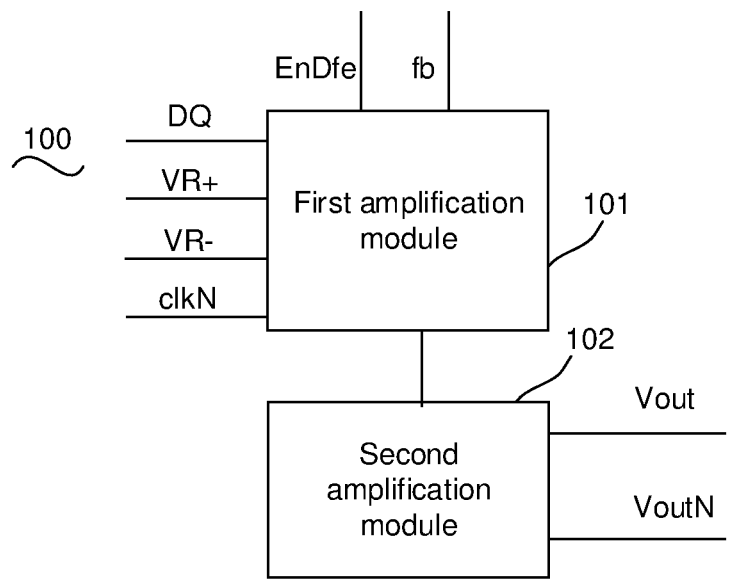
FIG. 1 is a functional block diagram of a data receiving circuit according to one embodiment of the present disclosure.
Figure 3:
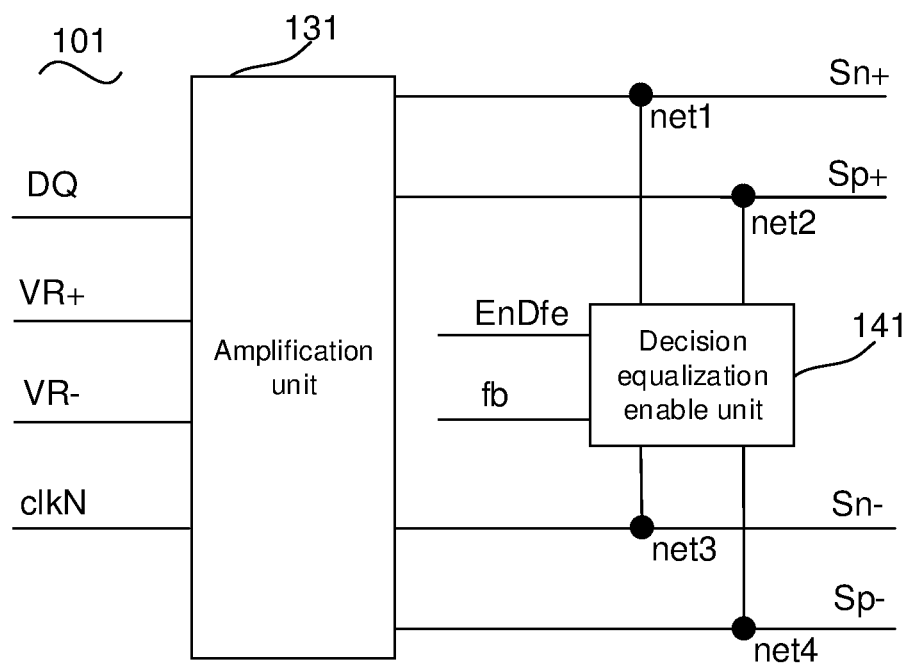
FIG. 3 is another functional block diagram of a data receiving circuit according to one embodiment of the present disclosure.
Figure 4:
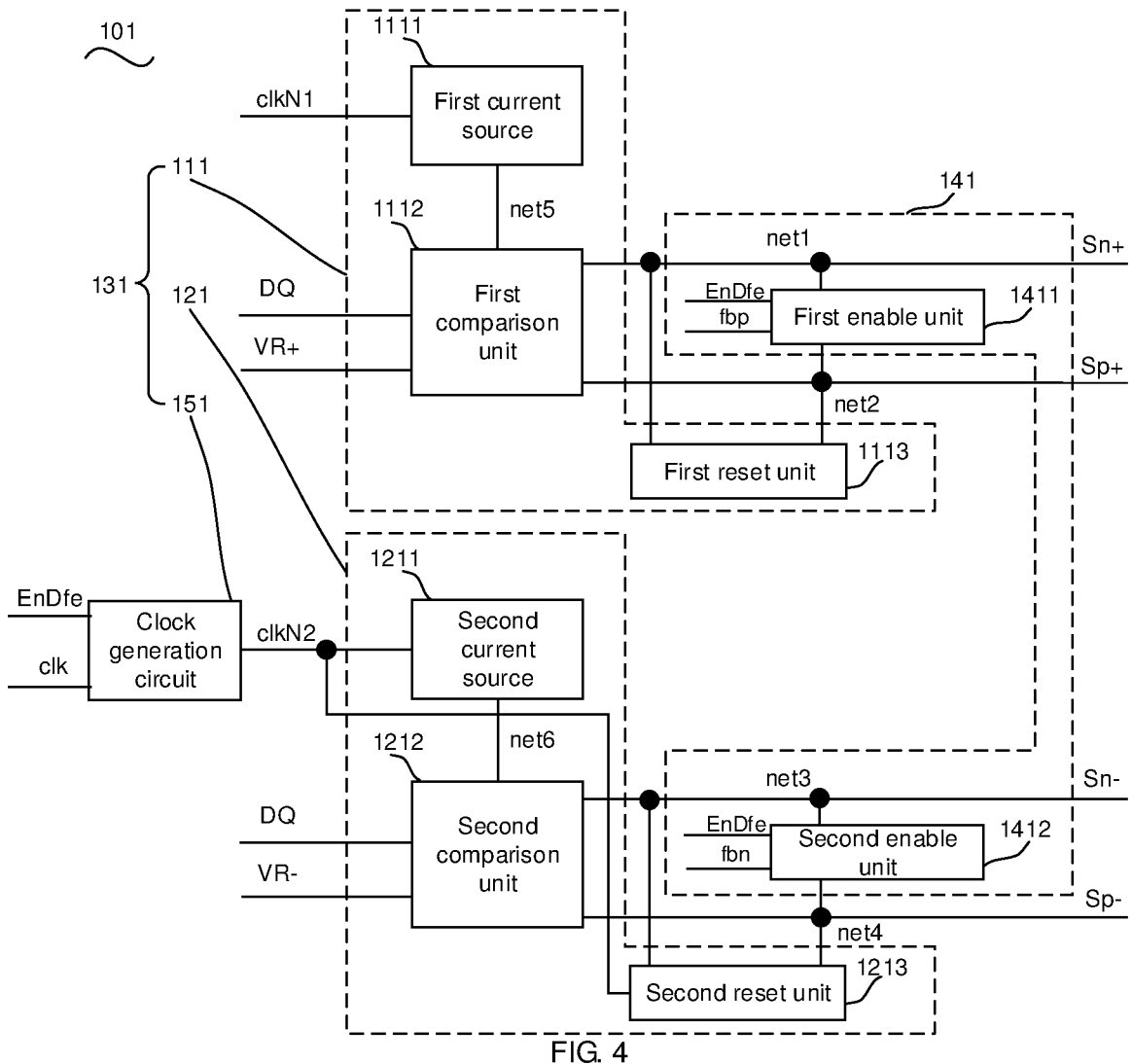
FIG. 4 is a functional block diagram of a first amplification module in a data receiving circuit according to one embodiment of the present disclosure.
Figure 5:
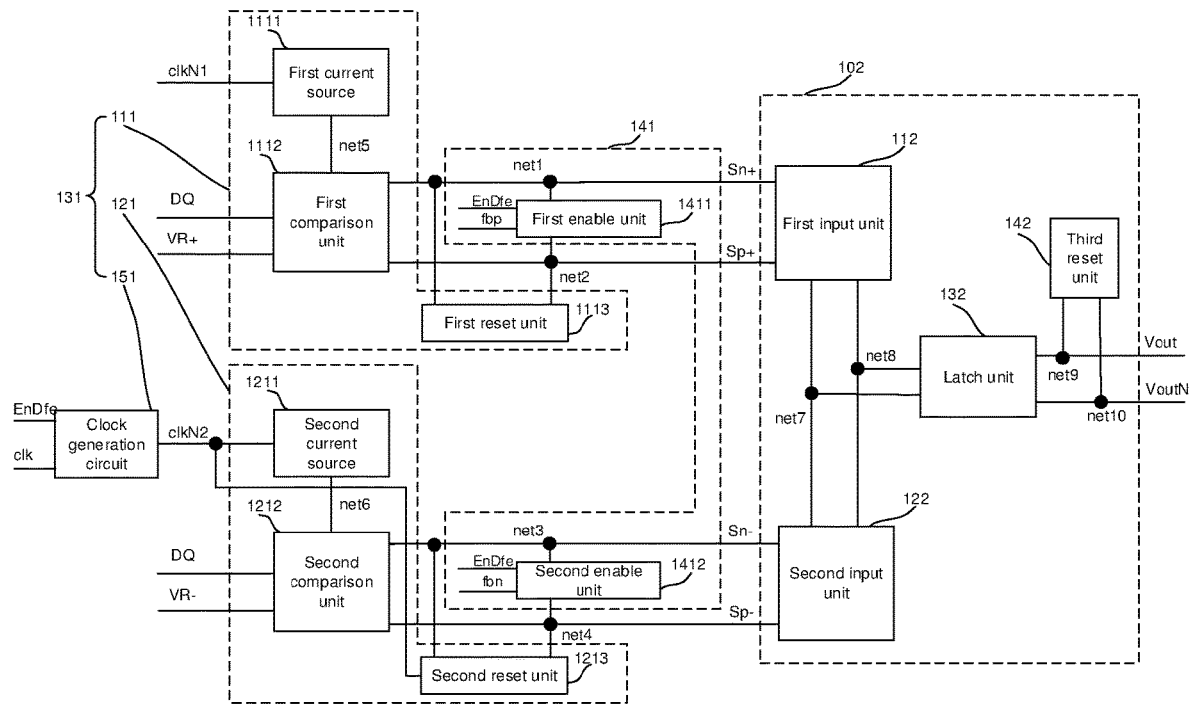
FIG. 5 is another functional block diagram of a data receiving circuit according to one embodiment of the present disclosure.
Figure 6:
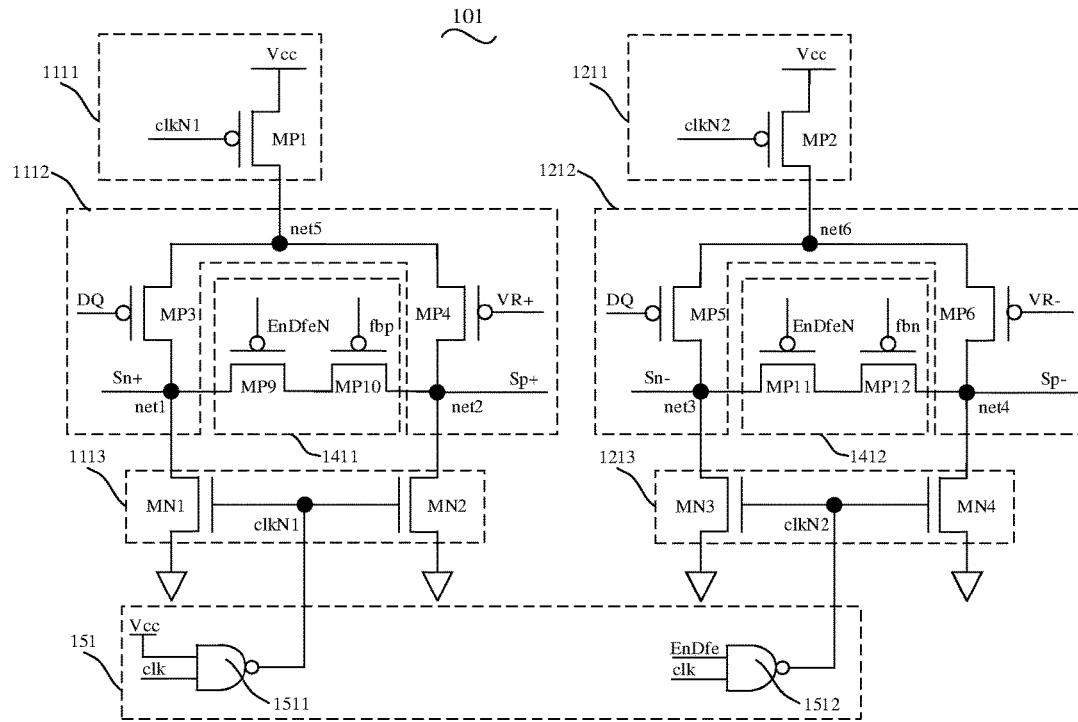
FIG. 6 is a schematic diagram of a circuit structure of a first amplification module in a data receiving circuit according to one embodiment of the present disclosure.
Figure 7:
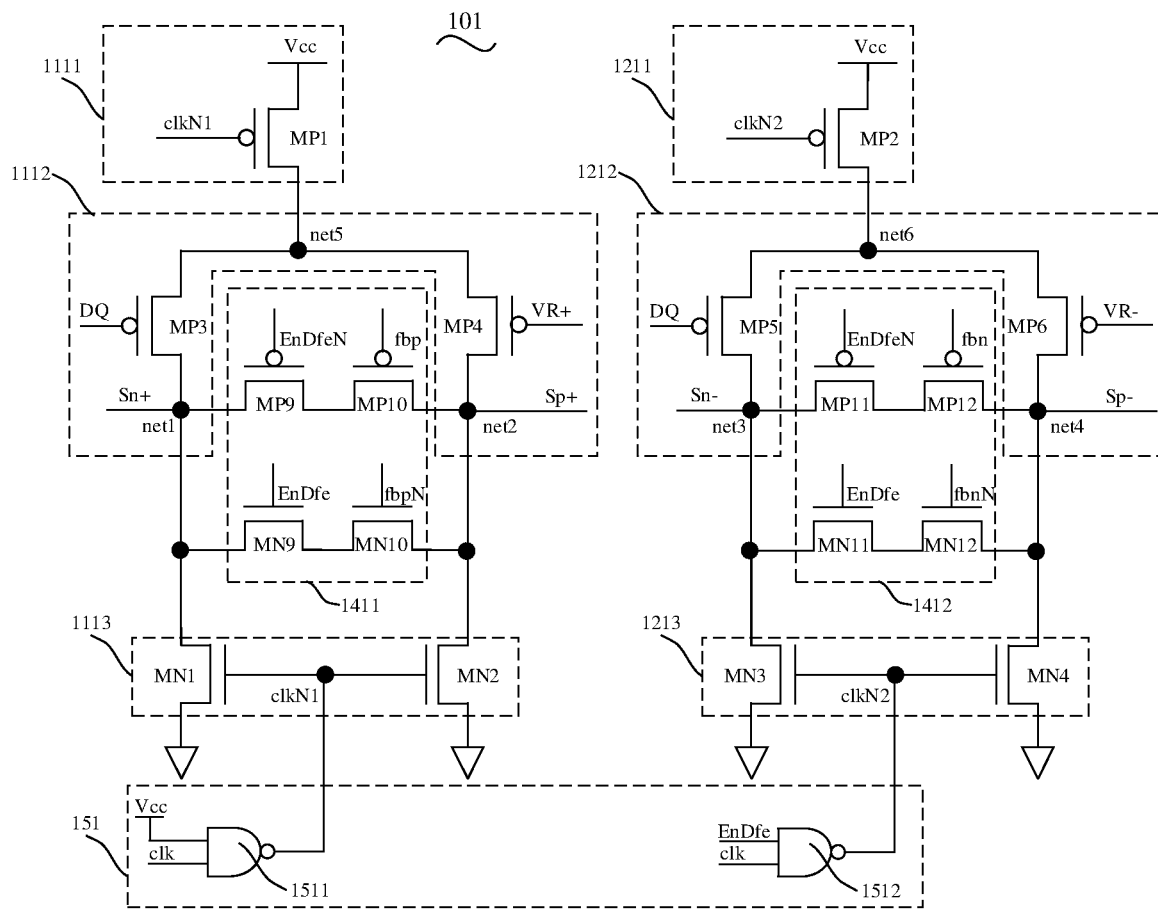
FIG. 7 is a schematic diagram of another circuit structure of a first amplification module in a data receiving circuit according to one embodiment of the present disclosure.
Figure 8:
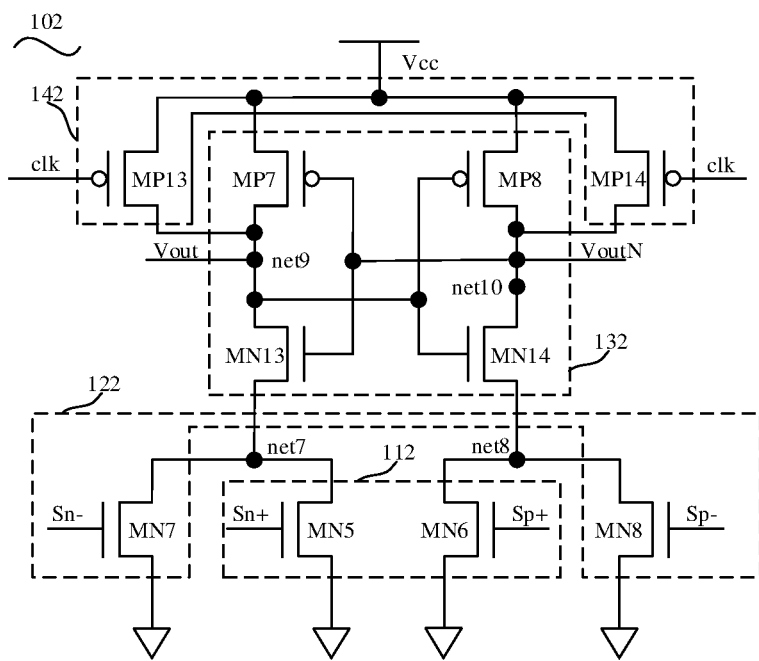
FIG. 8 is a schematic diagram of a circuit structure of a second amplification module in a data receiving circuit according to one embodiment of the present disclosure.

One embodiment of the present disclosure provides a data receiving circuit. The data receiving circuit provided by one embodiment of the present disclosure is described in detail below with reference to the accompanying drawings. FIG. 1 is a functional block diagram of a data receiving circuit according to one embodiment of the present disclosure; FIG. 3 is another functional block diagram of a data receiving circuit according to one embodiment of the present disclosure; FIG. 4 is a functional block diagram of a first amplification module in a data receiving circuit according to one embodiment of the present disclosure; FIG. 5 is another functional block diagram of a data receiving circuit according to one embodiment of the present disclosure; FIG. 6 is a schematic diagram of a circuit structure of a first amplification module in a data receiving circuit according to one embodiment of the present disclosure; FIG. 7 is a schematic diagram of another circuit structure of a first amplification module in a data receiving circuit according to one embodiment of the present disclosure; and FIG. 8 is a schematic diagram of a circuit structure of a second amplification module in a data receiving circuit according to one embodiment of the present disclosure.

Referring to FIG. 1 and FIG. 3, the data receiving circuit 100 includes a first amplification module 101 configured to: receive a data signal DQ, a first reference signal VR+, and a second reference signal VR−; when an enable signal EnDfe is at a first level, in response to a sampling clock signal clkN and on the basis of a feedback signal fb, select the data signal DQ and the first reference signal VR+ for first comparison and output a first signal pair as a result of the first comparison, or select the data signal DQ and the second reference signal VR− for second comparison and output a second signal pair as a result of the second comparison; and when the enable signal EnDfe is at a second level, perform the first comparison in response to the sampling clock signal clkN, and output the first signal pair; where, the first signal pair includes a first signal Sn+ and a second signal Sp+, and the second signal pair includes a third signal Sn− and a fourth signal Sp−; and a second amplification module 102 configured to receive output signals of the first amplification module 101 as an input signal pair, perform amplification processing on a voltage difference of the input signal pair, and output a first output signal Vout and a second output signal VoutN as a result of the amplification processing.

It can be understood that, when the enable signal EnDfe is at the first level, on the basis of the difference of the feedback signal fb previously received, the first amplification module 101 may selectively perform the first comparison or the second comparison on the basis of the current enable signal EnDfe and the different feedback signal fb, such that the first amplification module 101 outputs the valid first signal pair or the valid second signal pair, and the other one is the inactive signal pair at this time. It should be noted that, the valid first signal pair means that the level of the first signal Sn+ and the level of the second signal Sp+ in the first signal pair have a great difference; and the valid second signal pair means that the level of the third signal Sn− and the level of the fourth signal Sp− in the second signal pair have a great difference. In this way, it is ensured that the second amplification module 102 receives the pair of differential signals having a great level difference, thereby reducing the influence of the intersymbol interference of the received data signal DQ on the data receiving circuit 100.

In some embodiments, the level of the first reference signal VR+ is different from that of the second reference signal VR−, and then, for the data signal DQ having a different level, the data signal DQ may have a great level difference with one of the first reference signal VR+ and the second reference signal VR−. If the first amplification module 101 may perform the first comparison and the second comparison at the same time, the first amplification module 101 can output a group of signal pairs having a greater level difference. In one embodiment of the present disclosure, when there is an intersymbol interference phenomenon in the data signal DQ received by the data receiving circuit 100, the first amplification module 101 may selectively perform the first comparison or the second comparison on the basis of the difference of the feedback signal fb, one of the outputted first signal pair and second signal pair is valid, and the other one is invalid. The valid group of signal pairs refers to the group of signal pairs having a greater level difference if the first comparison and the second comparison may be performed at the same time, thereby reducing the influence of the intersymbol interference of the received data signal DQ on the data receiving circuit 100. It can be understood that, when the enable signal EnDfe is at the first level, the first amplification module 101 may selectively perform, on the basis of the received feedback signal fb, a comparison which better processes the data signal DQ, i.e., selectively performing the first comparison or the second comparison to obtain a better group of signal pairs. In this way, when the enable signal EnDfe is at the first level, the first amplification module 101 only performs the better one of the first comparison and the second comparison, and the other one is in the non-operating state, thereby facilitating reducing the power consumption of the data receiving circuit.

In addition, the second amplification module 102 receives the pair of differential signals having a great signal level difference, thereby facilitating improving the accuracy of the first output signal Vout and the second output signal VoutN outputted by the second amplification module 102. Therefore, the cooperation between the first amplification module 101 and the second amplification module 102 facilitates improving the receiving performance of the data receiving circuit 100.

On the other hand, when the enable signal EnDfe is at the second level, no matter how the level of the feedback signal fb obtained on the basis of the previously received data changes, the first amplification module 101 regularly performs the first comparison on the basis of the current enable signal EnDfe. That is, at this time, the first amplification module 101 regularly outputs the valid first signal pair and cannot perform the second comparison. That is, the circuit for outputting the second signal pair in the first amplification module 101 may be in the non-operating state, thereby facilitating further reducing the power consumption of the data receiving circuit.

On the basis of the above analysis, the first amplification module 101 may be further controlled using the enable signal EnDfe and the feedback signal fb, to select whether to consider the influence of the intersymbol interference of the data received by the data receiving circuit 100 on the data receiving circuit 100, thereby achieving the effect of reducing the power consumption of the data receiving circuit 100 while improving the receiving performance of the data receiving circuit 100.

How the data receiving circuit 100 reduces the influence of the intersymbol interference of the received data signal DQ on the data receiving circuit 100 will be described in detail below with reference to a specific example.

In some embodiments, the level of the first reference signal VR+ is higher than that of the second reference signal VR−. If the data signal DQ is at a low level, and there is an intersymbol interference phenomenon in the data signal DQ received by the data receiving circuit 100, when the enable signal EnDfe is at the first level, the first amplification module 101 performs the first comparison on the basis of the current enable signal EnDfe and feedback signal fb, that is, the valid first signal pair is outputted. At this time, the level difference between the data signal DQ and the first reference signal VR+ is greater than that between the data signal DQ and the second reference signal VR−, then performing the first comparison will generate an output signal pair having a greater level difference than performing the second comparison at this time. Therefore, the second amplification module 102 receives the first signal pair obtained by performing the first comparison, thereby facilitating outputting the first output signal Vout and the second output signal VoutN that meet requirements, i.e., ensuring the accuracy of the first output signal Vout and the second output signal VoutN, and facilitating reducing the influence of the intersymbol interference of the received data signal DQ on the data receiving circuit 100.

In addition, if the data signal DQ is at a high level, and there is an intersymbol interference phenomenon in the data signal DQ received by the data receiving circuit 100, when the enable signal EnDfe is at the first level, the first amplification module 101 performs the second comparison on the basis of the current enable signal EnDfe and feedback signal fb, that is, the valid second signal pair is outputted. At this time, the level difference between the data signal DQ and the first reference signal VR+ is less than that between the data signal DQ and the second reference signal VR−, then performing the second comparison will generate an output signal pair having a greater level difference than performing the first comparison at this time. Therefore, the second amplification module 102 receives the second signal pair obtained by performing the second comparison, thereby facilitating outputting the first output signal Vout and the second output signal VoutN that meet requirements, i.e., ensuring the accuracy of the first output signal Vout and the second output signal VoutN, and facilitating reducing the influence of the intersymbol interference of the received data signal DQ on the data receiving circuit 100.

It can be understood that, in actual applications, the level of the first reference signal VR+ may also be lower than that of the second reference signal VR−.

Hence, when the enable signal EnDfe is at the first level, the first amplification module 101 selectively performs the first comparison and the second comparison on the basis of the feedback signal fb having a variable level to output the first signal pair or the second signal pair having a greater level difference, to improve the accuracy of the first output signal Vout and the second output signal VoutN subsequently outputted by the second amplification module 102, thereby reducing the influence of the intersymbol interference of the received data signal DQ on the data receiving circuit 100.

In some embodiments, referring to FIG. 3, the first amplification module 101 may include: an amplification unit 131 provided with a first node net1, a second node net2, a third node net3, and a fourth node net4 respectively configured to output the first signal Sn+, the second signal Sp+, the third signal Sn−, and the fourth signal Sp− in response to the sampling clock signal clkN, wherein the amplification unit 131 is configured to receive the data signal DQ, the first reference signal VR+, and the second reference signal VR−; and a decision equalization enable unit 141 connected between the first node nett and the second node net2 as well as between the third node net3 and the fourth node net4, and configured to: receive the enable signal EnDfe and the feedback signal fb; when the enable signal EnDfe is at the first level, on the basis of the feedback signal fb, turn on a connection path between the first node nett and the second node net2, or turn on a connection path between the third node net3 and the fourth node net4; and when the enable signal EnDfe is at the second level, turn off the connection path between the first node nett and the second node net2, and turn off the connection path between the third node net3 and the fourth node net4.

It should be noted that, when the decision equalization enable unit 141 turns on the connection path between the first node nett and the second node net2 on the basis of the enable signal EnDfe and the feedback signal fb, the level of the first signal Sn+ outputted by the first node nett is equal to that of the second signal Sp+ outputted by the second node net2, that is, the amplification unit 131 does not perform the first comparison and cannot output the valid first signal pair. When the decision equalization enable unit 141 turns on the connection path between the third node net3 and the fourth node net4 on the basis of the enable signal EnDfe and the feedback signal fb, the level of the third signal Sn− outputted by the third node net3 is equal to that of the fourth signal Sp− outputted by the fourth node net4, that is, the amplification unit 131 does not perform the second comparison and cannot output the valid second signal pair.

It can be understood that, when the influence of the intersymbol interference on the data receiving circuit 100 needs to be reduced, when the enable signal EnDfe is at the first level, the decision equalization enable unit 141 selectively turns on the connection path between the first node nett and the second node net2 or the connection path between the third node net3 and the fourth node net4 on the basis of the current enable signal EnDfe and feedback signal fb, where the two nodes of the turned-on path cannot output the valid signal pair, such that the amplification unit 131 selectively performs the first comparison or the second comparison. When the influence of the intersymbol interference on the data receiving circuit 100 does not need to be considered, when the enable signal EnDfe is at the second level, the decision equalization enable unit 141 turns off the connection path between the first node nett and the second node net2 and the connection path between the third node net3 and the fourth node net4 on the basis of the current enable signal EnDfe, and the amplification unit 131 only performs the first comparison through the control itself. In addition, the decision equalization enable unit 141 is integrated in the first amplification module 101, facilitating further reducing the overall layout area of the data receiving circuit 100.

It should be noted that, the case where the intersymbol interference needs to be considered is generally the case where the data signal DQ received by the data receiving circuit 100 is high-speed data, namely the case where the data transmission rate is very fast; and the case where the intersymbol interference does not need to be considered is the case where the data signal DQ received by the data receiving circuit 100 is generally low-speed data, namely the case where the data transmission rate is relatively slow.

In some embodiments, referring to FIG. 4 and FIG. 5, the sampling clock signal clkN includes a first sampling clock signal clkN1 and a second sampling clock signal clkN2. The amplification unit 131 includes: a first comparison circuit 111 provided with the first node nett and the second node net2, and configured to receive the data signal DQ and the first reference signal VR+ and perform the first comparison in response to the first sampling clock signal clkN1; a clock generation circuit 151 configured to receive the enable signal EnDfe and an original sampling clock signal clk and output the second sampling clock signal clkN2, where when the enable signal EnDfe is at the first level, a phase of the second sampling clock signal clkN2 is opposite to a phase of the original sampling clock signal clk, and when the enable signal EnDfe is at the second level, the second sampling clock signal clkN2 is a logic high-level signal; and a second comparison circuit 121 provided with the third node net3 and the fourth node net4, and configured to: receive the data signal DQ and the second reference signal VR−; when the enable signal EnDfe is at the first level, perform the second comparison in response to the second sampling clock signal clkN2; and when the enable signal EnDfe is at the second level, turn on a connection path between the third node net3 and a ground terminal, and turn on a connection path between the fourth node net4 and a ground terminal.

It can be understood that, regardless of whether the influence of the intersymbol interference on the data receiving circuit 100 needs to be considered, when the enable signal EnDfe is at the first level, when the decision equalization enable unit 141 turns on the connection path between the third node net3 and the fourth node net4 on the basis of the feedback signal fb, the first comparison circuit 111 may perform the first comparison in response to the first sampling clock signal clkN1; and when the enable signal EnDfe is at the second level, when the decision equalization enable unit 141 cannot turn on the connection path between the first node nett and the second node net2 on the basis of the current enable signal EnDfe, the first comparison circuit 111 may also perform the first comparison in response to the first sampling clock signal clkN1. Hence, no matter when the enable signal EnDfe is at the first level or when the enable signal EnDfe is at the second level, that is, regardless of whether the influence of the intersymbol interference on the data receiving circuit 100 needs to be considered, the first comparison circuit 111 may perform the first comparison in response to the first sampling clock signal clkN1. However, only when the enable signal EnDfe is at the first level, when the decision equalization enable unit 141 turns on the connection path between the first node nett and the second node net2 on the basis of the feedback signal fb, the second comparison circuit 121 may perform the second comparison in response to the second sampling clock signal clkN2 having a variable level. When the enable signal EnDfe is at the second level, the second sampling clock signal clkN2 is a logic high-level signal, the second comparison circuit 121 turns on the connection path between the third node net3 and the ground terminal and the connection path between the fourth node net4 and the ground terminal, and the level of the third signal Sn− outputted by the third node net3 and the level of the fourth signal Sp− outputted by the fourth node net4 are both pulled down to 0, that is, the second comparison circuit 121 does not perform the second comparison and cannot output the valid second signal pair.

In some embodiments, the phase of the first sampling clock signal clkN1 is opposite to the phase of the original sampling clock signal clk. When the enable signal EnDfe is at the first level, the phase of the second sampling clock signal clkN2 is opposite to the phase of the original sampling clock signal clk, and the phase of the first sampling clock signal clkN1 is synchronous with the current phase of the second sampling clock signal clkN2, such that at this time, the first comparison circuit 111 may perform the first comparison in response to the first sampling clock signal clkN1, or the second comparison circuit 121 may perform the second comparison in response to the second sampling clock signal clkN2. Meanwhile, the decision equalization enable unit 141 further controls potentials at the first node net1, the second node net2, the third node net3, and the fourth node net4 on the basis of the enable signal EnDfe and the feedback signal fb. For example, the potential at the first node nett is the same as the potential at the second node net2, such that the amplification unit 131 actually does not perform the first comparison and cannot output the valid first signal pair; or, the potential at the third node net3 is the same as the potential at the fourth node net4, such that the amplification unit 131 actually does not perform the second comparison and cannot output the valid second signal pair. Hence, the cooperation between the amplification unit 131 and the decision equalization enable unit 141 may enable the amplification unit 131 to selectively perform the first comparison or the second comparison.

In some embodiments, referring to FIG. 4 and FIG. 5, the feedback signal fb may include a first feedback signal fbp and a second feedback signal fbn differential to each other. The decision equalization enable unit 141 may include: a first enable unit 1411 configured to be turned on in response to the enable signal EnDfe and the first feedback signal fbp, to connect the first node nett and the second node net2; and a second enable unit 1412 configured to be turned on in response to the enable signal EnDfe and the second feedback signal fbn, to connect the third node net3 and the fourth node net4; where, when the enable signal EnDfe is at the first level, the first enable unit 1411 or the second enable unit 1412 is turned on, and when the enable signal EnDfe is at the second level, the first enable unit 1411 and the second enable unit 1412 are both turned off.

It can be understood that, when the first feedback signal fbp is at a high level, the second feedback signal fbn is at a low level; and when the first feedback signal fbp is at a low level, the second feedback signal fbn is at a high level. In this way, when the enable signal EnDfe is at the first level, the first enable unit 1411 for receiving the first feedback signal fbp or the second enable unit 1412 for receiving the second feedback signal fbn is turned on, and the first node net1 and the second node net2 as well as the third node net3 and the fourth node net4 are alternatively connected, such that the first amplification module 101 selectively performs the first comparison or the second comparison. When the enable signal EnDfe is at the second level, no matter how the level of the first feedback signal fbp and the level of the second feedback signal fbn change, the first enable unit 1411 and the second enable unit 1412 are both turned off on the basis of the current enable signal EnDfe, and the amplification unit 131 only performs the first comparison through the control itself.

In some embodiments, referring to FIG. 6 and FIG. 7, the first enable unit 1411 may include: a ninth P-channel metal oxide semiconductor (PMOS) transistor MP9 and a tenth PMOS transistor MP10, the ninth PMOS transistor MP9 being provided with one end connected to the first node net1, a gate for receiving a complementary enable signal EnDfeN, and the other end connected to one end of the tenth PMOS transistor MP10, the tenth PMOS transistor MP10 being provided with the other end connected to the second node net2 and a gate for receiving the first feedback signal fbp, and a level of the complementary enable signal EnDfeN being opposite to a level of the enable signal EnDfe.

It should be noted that, the level of the complementary enable signal EnDfeN being opposite to the level of the enable signal EnDfe means that when one of the complementary enable signal EnDfeN and the enable signal EnDfe is at a high level, the other one is at a low level.

In one example, when the influence of the intersymbol interference on the data receiving circuit 100 needs to be reduced, the complementary enable signal EnDfeN is at a low level, the ninth PMOS transistor MP9 is turned on, at this time, the tenth PMOS transistor MP10 is turned on or off on the basis of the received first feedback signal fbp, and the first enable unit 1411 is turned on or off on the basis of the first feedback signal fbp. When the first feedback signal fbp is at a high level, the tenth PMOS transistor MP10 is turned off, and the first comparison circuit 111 may perform the first comparison in response to the first sampling clock signal clkN1 to output the valid first signal pair. When the influence of the intersymbol interference on the data receiving circuit 100 does not need to be considered, the complementary enable signal EnDfeN is at a high level, the ninth PMOS transistor MP9 is turned off, and at this time, no matter the first feedback signal fbp is at a high level or low level, the first enable unit 1411 is turned off. The first comparison circuit 111 is not controlled by the first enable unit 1411, and may always perform the first comparison in response to the first sampling clock signal clkN1.

In some embodiments, referring to FIG. 7, on the basis that the first enable unit 1411 includes the ninth PMOS transistor MN9 and the tenth PMOS transistor MN10, the first enable unit 1411 may further include a ninth N-channel metal oxide semiconductor (NMOS) transistor MN9 and a tenth NMOS transistor MN10, the ninth NMOS transistor MN9 being provided with one end connected to the first node net1, a gate for receiving the enable signal EnDfe, and the other end connected to one end of the tenth NMOS transistor MN10, the tenth NMOS transistor MN10 being provided with the other end connected to the second node net2 and a gate for receiving a first complementary feedback signal fbpN, and a level of the first complementary feedback signal fbpN being opposite to a level of the first feedback signal fbp.

It should be noted that, that the enable signal EnDfe is at the first level means that the first enable unit 1411 determines that the enable signal EnDfe is a level range of logic level 1, namely a high level; and that the enable signal EnDfe is at the second level means that the first enable unit 1411 determines that the enable signal EnDfe is a level range of logic level 0, namely a low level. The level of the first complementary feedback signal fbpN being opposite to the level of the first feedback signal fbp means that when one of the first complementary feedback signal fbpN and the first feedback signal fbp is at a high level, the other one is at a low level.

In one example, when the influence of the intersymbol interference on the data receiving circuit 100 needs to be reduced, the enable signal EnDfe is at a high level, the complementary enable signal EnDfeN is at a low level, the ninth PMOS transistor MP9 and the ninth NMOS transistor MN9 are both turned on, at this time, the tenth PMOS transistor MP10 is turned on or off on the basis of the received first feedback signal fbp, the tenth NMOS transistor MN10 is turned on or off on the basis of the first complementary feedback signal fbpN, and the first enable unit 1411 is turned on or off on the basis of the first feedback signal fbp and the first complementary feedback signal fbpN. When the first feedback signal fbp is at a high level, and the first complementary feedback signal fbpN is at a low level, the tenth PMOS transistor MP10 and the tenth NMOS transistor MN10 are both turned off, and the first comparison circuit 111 may perform the first comparison in response to the first sampling clock signal clkN1 to output the valid first signal pair. When the influence of the intersymbol interference on the data receiving circuit 100 does not need to be considered, the enable signal EnDfe is at a low level, the complementary enable signal EnDfeN is at a high level, the ninth PMOS transistor MP9 and the ninth NMOS transistor MN9 are both turned off, and at this time, no matter the first feedback signal fbp and the first complementary feedback signal fbpN are at a high level or low level, the first enable unit 1411 is turned off. The first comparison circuit 111 is not controlled by the first enable unit 1411, and may always perform the first comparison in response to the first sampling clock signal clkN1.

In some embodiments, referring to FIG. 6 and FIG. 7, the second enable unit 1412 may include: an eleventh PMOS transistor MP11 and a twelfth PMOS transistor MP12, the eleventh PMOS transistor MP11 being provided with one end connected to the third node net3, a gate for receiving a complementary enable signal EnDfeN, and the other end connected to one end of the twelfth PMOS transistor MP12, the twelfth PMOS transistor MP12 being provided with the other end connected to the fourth node net4 and a gate for receiving the second feedback signal fbn, and a level of the complementary enable signal EnDfeN being opposite to a level of the enable signal EnDfe.

In one example, when the influence of the intersymbol interference on the data receiving circuit 100 needs to be reduced, the complementary enable signal EnDfeN is at a low level, the eleventh PMOS transistor MP11 is turned on, at this time, the twelfth PMOS transistor MP12 is turned on or off on the basis of the received second feedback signal fbn, and the second enable unit 1412 is turned on or off on the basis of the second feedback signal fbn. When the second feedback signal fbn is at a high level, the twelfth PMOS transistor MP12 is turned off, and the second comparison circuit 121 may perform the second comparison in response to the second sampling clock signal clkN2 to output the valid second signal pair. The first feedback signal fbp and the second feedback signal fbn are differential signals, such that when the influence of the intersymbol interference on the data receiving circuit 100 needs to be reduced, the first amplification module 101 selectively performs the first comparison or the second comparison on the basis of the feedback signal fb.

When the influence of the intersymbol interference on the data receiving circuit 100 does not need to be considered, the complementary enable signal EnDfeN is at a high level, the eleventh PMOS transistor MP11 is turned off, at this time, no matter the second feedback signal fbn is at a high level or a low level, the second enable unit 1412 is turned off, and the second comparison circuit 121 is not controlled by the second enable unit 1412. However, at this time, the second sampling clock signal clkN2 is a logic high-level signal, and the second comparison circuit 121 does not perform the second comparison and cannot output the valid second signal pair, such that when the influence of the intersymbol interference on the data receiving circuit 100 does not need to be considered, the first amplification module 101 only performs the first comparison in response to the first sampling clock signal clkN1.

In some embodiments, referring to FIG. 7, on the basis that the second enable unit 1412 includes the eleventh PMOS transistor MP11 and the twelfth PMOS transistor MP12, the second enable unit 1412 may further include an eleventh NMOS transistor MN11 and a twelfth NMOS transistor MN12, the eleventh NMOS transistor MN11 being provided with one end connected to the third node net3, a gate for receiving the enable signal EnDfe, and the other end connected to one end of the twelfth NMOS transistor MN12, the twelfth NMOS transistor MN12 being provided with the other end connected to the fourth node net4 and a gate for receiving a second complementary feedback signal fbnN, and a level of the second complementary feedback signal fbnN being opposite to a level of the second feedback signal fbn.

It should be noted that, the level of the second complementary feedback signal fbnN being opposite to the level of the second feedback signal fbn means that when one of the second complementary feedback signal fbnN and the second feedback signal fbn is at a high level, the other one is at a low level.

In one example, when the influence of the intersymbol interference on the data receiving circuit 100 needs to be reduced, the enable signal EnDfe is at a high level, the complementary enable signal EnDfeN is at a low level, the eleventh PMOS transistor MP11 and the eleventh NMOS transistor MN11 are both turned on, at this time, the twelfth PMOS transistor MP12 is turned on or off on the basis of the received second feedback signal fbn, the twelfth NMOS transistor MN12 is turned on or off on the basis of the received second complementary feedback signal fbnN, and the second enable unit 1412 is turned on or off on the basis of the second feedback signal fbn and the second complementary feedback signal fbnN. When the second feedback signal fbn is at a high level, and the second complementary feedback signal fbnN is at a low level, the twelfth PMOS transistor MP12 and the twelfth NMOS transistor MN12 are both turned off, and the second comparison circuit 121 may perform the second comparison in response to the second sampling clock signal clkN2 to output the valid second signal pair. The first feedback signal fbp and the second feedback signal fbn are differential signals, such that when the influence of the intersymbol interference on the data receiving circuit 100 needs to be reduced, the first amplification module 101 selectively performs the first comparison or the second comparison on the basis of the feedback signal fb.

When the influence of the intersymbol interference on the data receiving circuit 100 does not need to be considered, the enable signal EnDfe is at a low level, the complementary enable signal EnDfeN is at a high level, the eleventh PMOS transistor MP11 and the eleventh NMOS transistor MN11 are both turned off, at this time, no matter the second feedback signal fbn and the second complementary feedback signal fbnN are at a high level or a low level, the second enable unit 1412 is turned off, and the second comparison circuit 121 is not controlled by the second enable unit 1412. However, at this time, the second sampling clock signal clkN2 is a logic high-level signal, and the second comparison circuit 121 does not perform the second comparison and cannot output the valid second signal pair, such that when the influence of the intersymbol interference on the data receiving circuit 100 does not need to be considered, the first amplification module 101 only performs the first comparison in response to the first sampling clock signal clkN1.

In some embodiments, referring to FIG. 4 and FIG. 5, the first comparison circuit 111 may include: a first current source 1111 connected between a power supply node Vcc (referring to FIG. 6) and a fifth node net5 and configured to provide a current to the fifth node net5 in response to the first sampling clock signal clkN1; a first comparison unit 1112 connected to the first node net1, the second node net2, and the fifth node net5, and configured to receive the data signal DQ and the first reference signal VR+, perform the first comparison when the first current source 1111 provides a current to the fifth node net5, and output the first signal Sn+ and the second signal Sp+; and a first reset unit 1113 connected to the first node nett and the second node net2 and configured to reset the first node nett and the second node net2 in response to the first sampling clock signal clkN1.

The second comparison circuit 121 may include: a second current source 1211 connected between a power supply node Vcc and a sixth node net6 and configured to provide a current to the sixth node net6 in response to the second sampling clock signal clkN2; a second comparison unit 1212 connected to the third node net3, the fourth node net4, and the sixth node net6, and configured to receive the data signal DQ and the second reference signal VR−, perform the second comparison when the second current source 1211 provides a current to the sixth node net6, and output the third signal Sn− and the fourth signal Sp−; and a second reset unit 1213 connected between the third node net3 and the fourth node net4 and configured to reset the third node net3 and the fourth node net4 in response to the second sampling clock signal clkN2.

It can be understood that, the first comparison unit 1112 may control a difference between the current provided to the first node nett and the current provided to the second node net2 on the basis of a voltage difference between the data signal DQ and the first reference signal VR+, to output the first signal Sn+ and the second signal Sp+. The second comparison unit 1212 may control a difference between the current provided to the third node net3 and the current provided to the fourth node net4 on the basis of a voltage difference between the data signal DQ and the second reference signal VR−, to output the third signal Sn− and the fourth signal Sp−. In addition, after the data receiving circuit 100 completes the reception of the data signal DQ, the first reference signal VR+, and the second reference signal VR− and the output of the first output signal Vout and the second output signal VoutN, the first reset unit 1113 may reset the level at the first node nett and the level at the second node net2 to an original value, and the second reset unit 1213 may reset the level at the third node net3 and the level at the fourth node net4 to an original value, such that the data receiving circuit 100 subsequently performs next data reception and processing.

In some embodiments, a circuit structure of the first current source 1111 is the same as that of the second current source 1211; and a circuit structure of the first comparison unit 1112 is the same as that of the second comparison unit 1212. Thus, the first signal pair outputted by the first comparison circuit 111 is mainly influenced by the first reference signal VR+, or the second signal pair outputted by the second comparison circuit 121 is mainly influenced by the second reference signal VR−, such that the data receiving circuit 100 may further reduce, on the basis of the first reference signal VR+ and the second reference signal VR−, the influence of the intersymbol interference of the received data signal DQ on the data receiving circuit 100, thereby further improving the accuracy of the first output signal Vout and the second output signal VoutN outputted by the second amplification module 102.

In some embodiments, referring to FIG. 6 and FIG. 7, the first current source 1111 may include: a first PMOS transistor MP1 connected between the power supply node Vcc and the fifth node net5 and provided with a gate for receiving the first sampling clock signal clkN1. The second current source 1211 may include: a second PMOS transistor MP2 connected between the power supply node Vcc and the sixth node net6 and provided with a gate for receiving the second sampling clock signal clkN2.

Thus, when the first sampling clock signal clkN1 is at a low level, the gate of the first PMOS transistor MP1 is turned on by receiving the first sampling clock signal clkN1, to provide the current to the fifth node net5, such that the first comparison unit 1112 is in an operating state. That is, the first comparison is performed on the received data signal DQ and first reference signal VR+. Meanwhile, the enable signal EnDfe is at a high level, the complementary enable signal EnDfeN is at a low level, the first feedback signal fbp is at a high level, and the first complementary feedback signal fbpN is at a low level, such that the first enable unit 1411 turns off the first node nett and the second node net2. When the second sampling clock signal clkN2 is at a low level, the gate of the second PMOS transistor MP2 is turned on by receiving the second sampling clock signal clkN2, to provide the current to the sixth node net6, such that the second comparison unit 1212 is in an operating state, and the second comparison is performed on the received data signal DQ and second reference signal VR−. Meanwhile, the enable signal EnDfe is at a high level, the complementary enable signal EnDfeN is at a low level, the second feedback signal fbn is at a high level, and the second complementary feedback signal fbnN is at a low level, such that the second enable unit 1412 turns off the third node net3 and the fourth node net4.

In some embodiments, the phase of the first sampling clock signal clkN1 is opposite to the phase of the original sampling clock signal clk. When the influence of the intersymbol interference on the data receiving circuit 100 needs to be reduced, when the enable signal EnDfe is at the first level, namely high level, the phase of the second sampling clock signal clkN2 is also opposite to the phase of the original sampling clock signal clk, and at this time, the phase of the first sampling clock signal clkN1 is synchronous with the phase of the second sampling clock signal clkN2, such that the first current source 1111 may provide the current to the fifth node net5 for the preparation of the first comparison unit 1112 performing the first comparison, and the second current source 1211 may provide the current to the sixth node net6 for the preparation of the second comparison unit 1212 performing the second comparison. At this time, the enable signal EnDfe is at a high level, and the complementary enable signal EnDfeN is at a low level. If the first feedback signal fbp is at a high level, and the first complementary feedback signal fbpN is at a low level, the first enable unit 1411 turns off the first node nett and the second node net2, and the first comparison unit 1112 performs the first comparison. At this time, the second feedback signal fbn is at a low level, and the second complementary feedback signal fbnN is at a high level, the second enable unit 1412 connects the third node net3 and the fourth node net4, and the second comparison unit 1212 cannot perform the second comparison. If the first feedback signal fbp is at a low level, and the first complementary feedback signal fbpN is at a high level, the first enable unit 1411 connects the first node nett and the second node net2, and the first comparison unit 1112 cannot perform the first comparison. At this time, the second feedback signal fbn is at a high level, and the second complementary feedback signal fbnN is at a low level, the second enable unit 1412 turns off the third node net3 and the fourth node net4, and the second comparison unit 1212 performs the second comparison.

In addition, when the influence of the intersymbol interference on the data receiving circuit 100 does not need to be considered, when the enable signal EnDfe is at the second level, namely low level, the second sampling clock signal clkN2 is a logic high-level signal, and the second PMOS transistor MP2 is always turned off, such that the current in the second comparison unit 1212 is almost 0, to reduce the power consumption of the data receiving circuit 100. Moreover, at this time, the second comparison unit 1212 cannot perform the second comparison and cannot output the valid second signal pair. At this time, the first sampling clock signal clkN1 is a clock signal, and the first PMOS transistor MP1 may be turned on in response to the clock signal, such that the first comparison unit 1112 performs the first comparison to output the valid first signal pair, such that the data receiving circuit 100 may normally operate as a whole.

In some embodiments, still referring to FIG. 6 and FIG. 7, the first comparison unit 1112 may include: a third PMOS transistor MP3 connected between the first node nett and the fifth node net5 and provided with a gate for receiving the data signal DQ; and a fourth PMOS transistor MP4 connected between the second node net2 and the fifth node net5 and provided with a gate for receiving the first reference signal VR+. The second comparison unit 1212 may include: a fifth PMOS transistor MP5 connected between the third node net3 and the sixth node net6 and provided with a gate for receiving the data signal DQ; and a sixth PMOS transistor MP6 connected between the fourth node net4 and the sixth node net6 and provided with a gate for receiving the second reference signal VR−.

It should be noted that, for the first comparison unit 1112, the level of the data signal DQ and the level of the first reference signal VR+ are changed asynchronously, such that the turn-on moment of the third PMOS transistor MP3 for receiving the data signal DQ is different from the turn-on moment of the fourth PMOS transistor MP4 for receiving the first reference signal VR+; and at the same moment, the turn-on degree of the third PMOS transistor MP3 is different from the turn-on degree of the fourth PMOS transistor MP4. It can be understood that, since the turn-on degree of the third PMOS transistor MP3 is different from the turn-on degree of the fourth PMOS transistor MP4, and the shunt capability of the third PMOS transistor MP3 to the current at the fifth node net5 is also different from the shunt capability of the fourth PMOS transistor MP4 to the current at the fifth node net5, the voltage at the first node nett is different from the voltage at the second node net2, thereby facilitating outputting the first signal pair in which the first signal Sn+ and the second signal Sp+ have a great signal level difference.

For the second comparison unit 1212, the level of the data signal DQ and the level of the second reference signal VR− are changed asynchronously, such that the turn-on moment of the fifth PMOS transistor MP5 for receiving the data signal DQ is different from the turn-on moment of the sixth PMOS transistor MP6 for receiving the second reference signal VR−; and at the same moment, the turn-on degree of the fifth PMOS transistor MP5 is different from the turn-on degree of the sixth PMOS transistor MP6. It can be understood that, since the turn-on degree of the fifth PMOS transistor MP5 is different from the turn-on degree of the sixth PMOS transistor MP6, and the shunt capability of the fifth PMOS transistor MP5 to the current at the sixth node net6 is also different from the shunt capability of the sixth PMOS transistor MP6 to the current at the sixth node net6, the voltage at the third node net3 is different from the voltage at the fourth node net4, thereby facilitating outputting the second signal pair in which the third signal Sn− and the fourth signal Sp− have a great signal level difference.

In one example, the first amplification module 101 performs the first comparison. When the level of the data signal DQ is lower than the level of the first reference signal VR+, the turn-on degree of the third PMOS transistor MP3 is greater than the turn-on degree of the fourth PMOS transistor MP4, such that more current at the fifth node net5 flows into a channel where the third PMOS transistor MP3 is located, and the current at the first node nett is greater than the current at the second node net2, thereby further making the level of the first signal Sn+ outputted by the first node nett high, and making the level of the second signal Sp+ outputted by the second node net2 low. In another example, the first amplification module 101 performs the second comparison. When the level of the data signal DQ is lower than the level of the second reference signal VR−, the turn-on degree of the fifth PMOS transistor MP5 is greater than the turn-on degree of the sixth PMOS transistor MP6, such that more current at the sixth node net6 flows into a channel where the fifth PMOS transistor MP5 is located, and the current at the third node net3 is greater than the current at the fourth node net4, thereby further making the level of the third signal Sn− outputted by the third node net3 high, and making the level of the fourth signal Sp− outputted by the fourth node net4 low.

Similarly, the level of the data signal DQ is higher than the level of the first reference signal VR+, the turn-on degree of the third PMOS transistor MP3 is less than the turn-on degree of the fourth PMOS transistor MP4, the level of the first signal Sn+ outputted by the first node nett is low, and the level of the second signal Sp+ outputted by the second node net2 is high. When the level of the data signal DQ is higher than the level of the second reference signal VR−, the turn-on degree of the fifth PMOS transistor MP5 is less than the turn-on degree of the sixth PMOS transistor MP6, the level of the third signal Sn− outputted by the third node net3 is low, and the level of the fourth signal Sp− outputted by the fourth node net4 is high.

In some embodiments, still referring to FIG. 6 and FIG. 7, the first reset unit 1113 may include: a first NMOS transistor MN1 connected between the first node nett and a ground terminal and provided with a gate for receiving the first sampling clock signal clkN1; and a second NMOS transistor MN2 connected between the second node net2 and the ground terminal and provided with a gate for receiving the first sampling clock signal clkN1. The second reset unit 1213 may include: a third NMOS transistor MN3 connected between the third node net3 and a ground terminal and provided with a gate for receiving the second sampling clock signal clkN2; and a fourth NMOS MN4 transistor connected between the fourth node net4 and the ground terminal and provided with a gate for receiving the second sampling clock signal clkN2.

In one example, the phase of the first sampling clock signal clkN1 is opposite to the phase of the original sampling clock signal clk. When the influence of the intersymbol interference on the data receiving circuit needs to be reduced, when the enable signal EnDfe is at the first level, the phase of the second sampling clock signal clkN2 is also opposite to the phase of the original sampling clock signal clk, and at this time, the phase of the first sampling clock signal clkN1 is synchronous with the phase of the second sampling clock signal clkN2. If the first sampling clock signal clkN1 and the second sampling clock signal clkN2 are both at a low level, the first PMOS transistor MP1 and the second PMOS transistor MP2 are both turned on, at this time, the first NMOS transistor MN1, the second NMOS transistor MN2, the third NMOS transistor MN3, and the fourth NMOS transistor MN4 are all turned off, and at this time, one of the first enable unit 1411 and the second enable unit 1412 is controlled to be turned on based on the feedback signal fb, such that the first amplification module 101 selectively performs the first comparison or the second comparison. Moreover, the first NMOS transistor MN1 and the second NMOS transistor MN2 may serve as loads of the first comparison unit 1112 to increase the amplification gain of the first comparison unit 1112. The third NMOS transistor MN3 and the fourth NMOS transistor MN4 may serve as loads of the second comparison unit 1212 to increase the amplification gain of the second comparison unit 1212.

If the first sampling clock signal clkN1 and the second sampling clock signal clkN2 are both at a high level, the first PMOS transistor MP1 and the second PMOS transistor MP2 are both turned off, and there is no current flowing through the first comparison unit 1112 and the second comparison unit 1212. At this time, the first NMOS transistor MN1, the second NMOS transistor MN2, the third NMOS transistor MN3, and the fourth NMOS transistor MN4 are all turned on, and the voltage at the first node net1, the voltage at the second node net2, the voltage at the third node net3, and the voltage at the fourth node net4 are pulled down to reset the first node net1, the second node net2, the third node net3, and the fourth node net4, such that the data receiving circuit 100 subsequently performs next data reception and processing.

In addition, when the influence of the intersymbol interference on the data receiving circuit 100 does not need to be considered, when the enable signal EnDfe is at the second level, the second sampling clock signal clkN2 is a logic high-level signal, the second PMOS transistor MP2 is always turned off, at this time, the third NMOS transistor MN3 and the fourth NMOS transistor MN4 are both turned on, the connection path between the third node net3 and the ground terminal is pulled down and turned on, and the connection path between the fourth node net4 and the ground terminal is turned on to reset the third node net3 and the fourth node net4. At this time, there is almost 0 current in the second comparison unit 1212, thereby facilitating reducing the power consumption of the data receiving circuit 100. At this time, if the first sampling clock signal clkN1 is at a low level, the first PMOS transistor MP1 is turned on, and the first NMOS transistor MN1 and the second NMOS transistor MN2 are both turned off, to ensure that the first comparison circuit 111 performs the first comparison and outputs the valid first signal pair, such that the second amplification module 102 may regularly receive the first signal pair subsequently. Or, if the first sampling clock signal clkN1 is at a high level, the first PMOS transistor MP1 is turned off, and the first NMOS transistor MN1 and the second NMOS transistor MN2 are both turned on, to pull down the voltage at the first node nett and the voltage at the second node net2 to reset the first node nett and the second node net2, such that the data receiving circuit 100 subsequently performs next data reception and processing.

In some embodiments, still referring to FIG. 6 and FIG. 7, the clock generation circuit 151 may include: a first NAND gate circuit 1511 provided with one input terminal for receiving the original sampling clock signal clk, the other input terminal connected to a power supply node Vcc, and an output terminal for outputting the first sampling clock signal clkN1.

It can be understood that the input terminal of the first NAND gate circuit 1511 connected to the power supply node Vcc receives a high level. At this time, if the original sampling clock signal clk received by the other input end of the first NAND gate circuit 1511 is at a high level, the first sampling clock signal clkN1 is at a low level; and if the original sampling clock signal clk received by the other input end of the first NAND gate circuit 1511 is at a low level, the first sampling clock signal clkN1 is at a high level. Thus, the phase of the first sampling clock signal clkN1 is opposite to the phase of the original sampling clock signal clk. Therefore, when the influence of the intersymbol interference on the data receiving circuit needs to be reduced, the phase of the first sampling clock signal clkN1 is synchronous with the phase of the second sampling clock signal clkN2, and the first amplification module 101 may selectively perform the first comparison or the second comparison.

In some embodiments, still referring to FIG. 6 and FIG. 7, the clock generation circuit 151 may include: a second NAND gate circuit 1512 provided with one input terminal for receiving the original sampling clock signal clk, the other input terminal for receiving the enable signal EnDfe, and an output terminal for outputting the second sampling clock signal clkN2.

It can be understood that the phase of the first sampling clock signal clkN1 is opposite to the phase of the original sampling clock signal clk. When the influence of the intersymbol interference on the data receiving circuit 100 needs to be reduced, the enable signal EnDfe is at a high level. If the original sampling clock signal clk is at a high level, the second sampling clock signal clkN2 outputted by the second NAND gate circuit 1512 is at a low level. At this time, the first sampling clock signal clkN1 is also at a low level, the first amplification module 101 selectively performs the better one of the first comparison and the second comparison on the basis of the feedback signal fb, the second amplification module 102 subsequently receives the valid first signal pair or the valid second signal pair, and the other group of signal pairs is invalid, to reduce the influence of the intersymbol interference of the received data signal DQ on the data receiving circuit 100. If the original sampling clock signal clk is at a low level, the second sampling clock signal clkN2 outputted by the second NAND gate circuit 1512 is at a high level. At this time, the first sampling clock signal clkN1 is also at a high level, and the first comparison unit 1112 and the second comparison unit 1212 are both in a non-operating state. The first reset unit 1113 may reset the level at the first node nett and the level at the second node net2 to an original value, and the second reset unit 1213 may reset the level at the third node net3 and the level at the fourth node net4 to an original value, such that the data receiving circuit 100 subsequently performs next data reception and processing.

When the influence of the intersymbol interference on the data receiving circuit 100 does not need to be considered, the enable signal EnDfe is at a low level. At this time, no matter the original sampling clock signal clk is at a high level or a low level, the second sampling clock signal clkN2 outputted by the second NAND gate circuit 1512 is at a high level. Therefore, no matter the first sampling clock signal clkN1 is at a high level or a low level, that is, no matter the first comparison unit 1112 performs the first comparison, the connection path between the third node net3 and the ground terminal and the connection path between the fourth node net4 and the ground terminal in the second comparison circuit 121 may both be turned on, such that there is almost 0 current in the second comparison circuit 121 at this time, and the second comparison cannot be performed.

In some embodiments, referring to FIG. 5, the second amplification module 102 may include: a first input unit 112 connected to a seventh node net7 and an eighth node net8, and configured to receive the first signal pair for third comparison and provide signals to the seventh node net7 and the eighth node net8, respectively, as a result of the third comparison; a second input unit 122 connected to the seventh node net7 and the eighth node net8, and configured to receive the second signal pair for fourth comparison and provide signals to the seventh node net7 and the eighth node net8, respectively, as a result of the fourth comparison; and a latch unit 132 connected to the seventh node net7 and the eighth node net8, and configured to amplify and latch a signal of the seventh node net7 and a signal of the eighth node net8, and output the first output signal Vout and the second output signal VoutN respectively through a first output node net9 and a second output node net10.

It can be understood that, when the influence of the intersymbol interference on the data receiving circuit needs to be reduced, when the enable signal EnDfe is at the first level, the first amplification module 101 selectively performs the first comparison and the second comparison on the basis of the feedback signal fb, one of the outputted first signal pair and second signal pair is valid, and the other one is invalid. Moreover, at this time, the input unit that may be turned on receives the valid signal pair; and the valid signal pair means that: if the first comparison and the second comparison may be performed at the same time, the group of signal pairs having a greater level difference can be outputted, thereby improving the accuracy of the first output signal Vout and the second output signal VoutN outputted by the second amplification module 102. When the influence of the intersymbol interference on the data receiving circuit 100 does not need to be considered, when the enable signal EnDfe is at the second level, the first amplification module 101 regularly outputs the valid first signal pair, the first input unit 112 is turned on or off in response to the valid first signal pair, and the signal pair received by the second input unit 122 is invalid such that the second input unit 122 is in an off state, thereby reducing the power consumption of the data receiving circuit.

The latch unit 132 is configured to output, according to the signal at the seventh node net7 and the signal at the eighth node net8, a high level signal to the first output node net9 and a low level signal to the second output node net10, or output a low level signal to the first output node net9 and a high level signal to the second output node net10.

In some embodiments, referring to FIG. 8, the first input unit 112 may include: a fifth NMOS transistor MN5 provided with a drain connected to the seventh node net7, a source connected to a ground terminal, and a gate for receiving the first signal Sn+; and a sixth NMOS transistor MN6 provided with a drain connected to the eighth node net8, a source connected to a ground terminal, and a gate for receiving the second signal Sp+. The second input unit 122 may include: a seventh NMOS transistor MN7 provided with a drain connected to the seventh node net7, a source connected to a ground terminal, and a gate for receiving the third signal Sn−; and an eighth NMOS transistor MN8 provided with a drain connected to the eighth node net8, a source connected to a ground terminal, and a gate for receiving the fourth signal Sp−.

In one example, when the first amplification module 101 performs the first comparison, if the level of the data signal DQ is higher than the level of the first reference signal VR+, the level of the first signal Sn+ is low, the level of the second signal Sp+ is high, and the turn-on degree of the sixth NMOS transistor MN6 is greater than the turn-on degree of the fifth NMOS transistor MN5, such that the voltage at the eighth node net8 is less than the voltage at the seventh node net7. Similarly, if the level of the data signal DQ is lower than the level of the first reference signal VR+, the level of the first signal Sn+ is high, the level of the second signal Sp+ is low, and the turn-on degree of the fifth NMOS transistor MN5 is greater than the turn-on degree of the sixth NMOS transistor MN6, such that the voltage at the seventh node net7 is less than the voltage at the eighth node net8.

In another example, when the first amplification module 101 performs the second comparison, if the level of the data signal DQ is higher than the level of the second reference signal VR−, the level of the third signal Sn− is low, the level of the fourth signal Sp− is high, and the turn-on degree of the eighth NMOS transistor MN8 is greater than the turn-on degree of the seventh NMOS transistor MN7, such that the voltage at the eighth node net8 is less than the voltage at the seventh node net7. Similarly, if the level of the data signal DQ is lower than the level of the second reference signal VR−, the level of the third signal Sn− is high, the level of the fourth signal Sp− is low, and the turn-on degree of the seventh NMOS transistor MN7 is greater than the turn-on degree of the eighth NMOS transistor MN8, such that the voltage at the seventh node net7 is less than the voltage at the eighth node net8.

In some embodiments, still referring to FIG. 8, the latch unit 132 may include: a thirteenth NMOS transistor MN13 and a seventh PMOS transistor MN7, a gate of the thirteenth NMOS transistor MN13 and a gate of the seventh PMOS transistor MN7 being both connected to the second output node net10, a source of the thirteenth NMOS transistor MN13 being connected to the seventh node net7, a drain of the thirteenth NMOS transistor MN13 and a drain of the seventh PMOS transistor MN7 being both connected to the first output node net9, and a source of the seventh PMOS transistor MN7 being connected to a power supply node Vcc; and a fourteenth NMOS transistor MN14 and an eighth PMOS transistor MN8, a gate of the fourteenth NMOS transistor MN14 and a gate of the eighth PMOS transistor MN8 being both connected to the first output node net9, a source of the fourteenth NMOS transistor MN14 being connected to the eighth node net8, a drain of the fourteenth NMOS transistor MN14 and a drain of the eighth PMOS transistor MN8 being both connected to the second output node net10, and a source of the eighth PMOS transistor MN8 being connected to the power supply node Vcc.

In one example, when the first amplification module 101 performs the first comparison, if the level of the data signal DQ is higher than the level of the first reference signal VR+, the level of the first signal Sn+ is low, the level of the second signal Sp+ is high, and the voltage at the eighth node net8 is less than the voltage at the seventh node net7, such that the turn-on degree of the fourteenth NMOS transistor MN14 is greater than the turn-on degree of the thirteenth NMOS transistor MN13, the voltage at the second output node net10 is less than the voltage at the first output node net9, and the turn-on degree of the eighth PMOS transistor MP8 is less than the turn-on degree of the seventh PMOS transistor MP7. The latch unit 132 forms positive feedback amplification, further making the first output signal Vout outputted by the first output node net9 at a high level, and making the second output signal VoutN outputted by the second output node net10 at a low level. Similarly, if the level of the data signal DQ is lower than the level of the first reference signal VR+, the voltage at the seventh node net7 is less than the voltage at the eighth node net8, the first output signal Vout outputted by the first output node net9 is at a low level, and the second output signal VoutN outputted by the second output node net10 is at a high level.

In another example, when the first amplification module 101 performs the second comparison, if the level of the data signal DQ is higher than the level of the second reference signal VR−, the level of the third signal Sn− is low, the level of the fourth signal Sp− is high, and the turn-on degree of the eighth NMOS transistor MN8 is greater than the turn-on degree of the seventh NMOS transistor MN7, such that the voltage at the eighth node net8 is less than the voltage at the seventh node net7, thereby making the first output signal Vout outputted by the first output node net9 at a high level, and making the second output signal VoutN outputted by the second output node net10 at a low level. Similarly, if the level of the data signal DQ is lower than the level of the second reference signal VR−, the level of the third signal Sn− is high, the level of the fourth signal Sp− is low, and at this time, the first output signal Vout outputted by the first output node net9 is at a low level, and the second output signal VoutN outputted by the second output node net10 is at a high level.

In some embodiments, referring to FIG. 5, the second amplification module 102 may further include: a third reset unit 142 connected between the power supply node Vcc and an output terminal of the latch unit 132 and configured to reset the output terminal of the latch unit 132. Thus, after the data receiving circuit 100 completes the reception of the data signal DQ, the first reference signal VR+, and the second reference signal VR− and the output of the first output signal Vout and the second output signal VoutN, the third reset unit 142 may reset the level at the first output node net9 and the level at the second output node net10 to an original value, such that the data receiving circuit 100 subsequently performs next data reception and processing.

In some embodiments, referring to FIG. 8, the third reset unit 142 includes: a thirteenth PMOS transistor MP13 connected between the first output node net9 and the power supply node Vcc and provided with a gate for receiving the original sampling clock signal clk; and a fourteenth PMOS transistor MP14 connected between the second output node net10 and the power supply node Vcc and provided with a gate for receiving the original sampling clock signal clk.

In one example, the phase of the first sampling clock signal clkN1 is opposite to the phase of the original sampling clock signal clk. Referring to FIG. 7 and FIG. 8, when the influence of the intersymbol interference on the data receiving circuit 100 needs to be reduced, the enable signal EnDfe is at a logic level 1, the complementary enable signal EnDfeN is at a logic level 0, and the phase of the second sampling clock signal clkN2 is opposite to the phase of the original sampling clock signal clk. When the original sampling clock signal clk is at a high level, the first sampling clock signal clkN1 and the second sampling clock signal clkN2 are both turned on, the first PMOS transistor MP1 and the second PMOS transistor MP2 are both turned on, and at this time, one of the first enable unit 1411 and the second enable unit 1412 is turned on based on the feedback signal fb, such that the first amplification module 101 only outputs one of the valid first signal pair and the valid second signal pair. For example, when the first feedback signal fbp is at a high level, and the second feedback signal fbn is at a low level, the first comparison unit 1112 performs the first comparison, and the second comparison unit 1212 cannot perform the second comparison. At this time, the first NMOS transistor MN1, the second NMOS transistor MN2, the third NMOS transistor MN3, the fourth NMOS transistor MN4, the thirteenth PMOS transistor MP13, and the fourteenth PMOS transistor MP14 are all turned off.

When the original sampling clock signal clk is at a low level, the first sampling clock signal clkN1 and the second sampling clock signal clkN2 are both at a high level, and the first PMOS transistor MP1 and the second PMOS transistor MP2 are both turned off. At this time, the first NMOS transistor MN1, the second NMOS transistor MN2, the third NMOS transistor MN3, and the fourth NMOS transistor MN4 are all turned on, and the voltage at the first node net1, the voltage at the second node net2, the voltage at the third node net3, and the voltage at the fourth node net4 are pulled down to reset the first node net1, the second node net2, the third node net3, and the fourth node net4. The thirteenth PMOS transistor MP13 and the fourteenth PMOS transistor MP14 are also turned on, and the voltage at the first output node net9 and the voltage at the second output node net10 are pulled up to reset the first output node net9 and the second output node net10.

When the influence of the intersymbol interference on the data receiving circuit 100 does not need to be considered, the enable signal EnDfe is at a logic level 0, and the complementary enable signal EnDfeN is at a logic level 1. At this time, no matter the original sampling clock signal clk is at a high level or a low level, the second sampling clock signal clkN2 is always at a high level, and the second PMOS transistor MP2 is always turned off, to reduce the current in the second comparison circuit 121, thereby reducing the power consumption of the data receiving circuit 100.

The specific working principle of the data receiving circuit 100 provided by one embodiment of the present disclosure will be described in detail below with reference to FIG. 6, FIG. 8, and Table 1.

In one example, when a plurality of data receiving circuits 100 are cascaded, the first output signal Vout outputted by the first output node net9 of a previous stage data receiving circuit 100 is used as the first feedback signal fbp of a next stage data receiving circuit 100, and the second output signal VoutN outputted by the second output node net10 of the previous stage data receiving circuit 100 is used as the second feedback signal fbn of the next stage data receiving circuit 100.

The following description is given by taking an example where the level of the received first reference signal VR+ is greater than the level of the second reference signal VR−. The data signal DQ being at a logic level 1 indicates that the level of the data signal DQ is greater than the level of the first reference signal VR+, and the data signal DQ being at a logic level 0 indicates that the level of the data signal DQ is less than the level of the second reference signal VR−. It should be noted that in Table 1, 1 represents a high level, and 0 represents a low level.

When the influence of the intersymbol interference on the data receiving circuit 100 needs to be considered, the enable signal EnDfe is at a high level, and the complementary enable signal EnDfeN is at a low level. At this time, the ninth PMOS transistor MP9 and the eleventh PMOS transistor MP11 are turned on, the tenth PMOS transistor MP10 is turned on or off in response to the first feedback signal fbp, and the twelfth PMOS transistor MP12 is turned on or off in response to the second feedback signal fbn.

Referring to Table 1, if the data signal DQ1 received by the previous stage data receiving circuit 100 is at a logic level 1, the first output signal Vout outputted by the previous stage data receiving circuit 100, namely the first feedback signal fbp of the next stage data receiving circuit 100 is at a high level, and the second output signal VoutN outputted by the previous stage data receiving circuit 100, namely the second feedback signal fbn of the next stage data receiving circuit 100 is at a low level. At this time, the gate of the tenth PMOS transistor MP10 is turned off by receiving the first feedback signal fbp, the gate of the twelfth PMOS transistor MP12 is turned on by receiving the second feedback signal fbn, the first amplification module 101 performs the first comparison, and the first node net1 and the second node net2 outputs the first signal Sn+ and the second signal Sp+. The first input unit 112 is configured to perform third comparison on the first signal Sn+ and the second signal Sp+, to provide a signal to the seventh node net7 and the eighth node net8, and there is no current flowing through the second input unit 122.

When the data signal DQ1 received by the previous stage data receiving circuit 100 is at a logic level 1, the data signal DQ2 received by the next stage data receiving circuit 100 is in the following two cases:

Case 1: referring to Table 1, when the data signal DQ2 received by the next stage data receiving circuit 100 is at a logic level 0, the data signal DQ2 received by the next stage data receiving circuit 100 and the data signal DQ1 received by the previous stage data receiving circuit 100 have a great level difference, and there is great intersymbol interference. At this time, the first amplification module 101 in the next stage data receiving circuit 100 performs the first comparison to output the first signal Sn+ and the second signal Sp+, such that the first input unit 112 is turned on, that is, the second amplification module 102 in the next stage data receiving circuit 100 receives the first signal Sn+ and the second signal Sp+. At this time, in the next stage data receiving circuit 100, the data signal DQ2 is at a logic level 0, and the voltage difference between the data signal DQ2 and the first reference signal VR+ is greater than the voltage difference between the data signal DQ2 and the second reference signal VR−. If the second comparison may be performed at this time, the level difference between the signals in the valid first signal pair obtained by performing the first comparison is greater than the level difference between the signals in the valid second signal pair obtained by performing the second comparison. At this time, the second amplification module 102 receives the valid first signal pair, more facilitating outputting the first output signal Vout and the second output signal VoutN having higher accuracy, to achieve the purpose of reducing the influence of the intersymbol interference of the received data signal DQ on the data receiving circuit 100; and at this time, the second comparison is not performed, which facilitates reducing the power consumption of the data receiving circuit 100.

Case 2: referring to Table 1, when the data signal DQ2 received by the next stage data receiving circuit 100 is at a logic level 1, the data signal DQ2 received by the next stage data receiving circuit 100 and the data signal DQ1 received by the previous stage data receiving circuit 100 have a small level difference, and there is small or no intersymbol interference. At this time, the first amplification module 101 in the next stage data receiving circuit 100 performs the first comparison to output the first signal Sn+ and the second signal Sp+, such that the first input unit 112 is turned on, that is, the second amplification module 102 in the next stage data receiving circuit 100 receives the first signal Sn+ and the second signal Sp+.

Referring to Table 1, if the data signal DQ1 received by the previous stage data receiving circuit 100 is at a logic level 0, the first output signal Vout outputted by the previous stage data receiving circuit 100, namely the first feedback signal fbp of the next stage data receiving circuit 100 is at a low level, and the second output signal VoutN outputted by the previous stage data receiving circuit 100, namely the second feedback signal fbn of the next stage data receiving circuit 100 is at a high level. At this time, the gate of the tenth PMOS transistor MP10 is turned on by receiving the first feedback signal fbp, the gate of the twelfth PMOS transistor MP12 is turned off by receiving the second feedback signal fbn, the first amplification module 101 performs the second comparison, and the third node net3 and the fourth node net4 outputs the third signal Sn– and the fourth signal Sp–. The second input unit 122 is configured to perform fourth comparison on the third signal Sn– and the fourth signal Sp–, to provide a signal to the seventh node net7 and the eighth node net8, and there is no current flowing through the first input unit 112.

When the data signal DQ1 received by the previous stage data receiving circuit 100 is at a logic level 0, the data signal DQ2 received by the next stage data receiving circuit 100 is in the following two cases:

Case 3: referring to Table 1, when the data signal DQ2 received by the next stage data receiving circuit 100 is at a logic level 0, the data signal DQ2 received by the next stage data receiving circuit 100 and the data signal DQ1 received by the previous stage data receiving circuit 100 have a small level difference, and there is small or no intersymbol interference. At this time, the first amplification module 101 in the next stage data receiving circuit 100 performs the second comparison to output the third signal Sn– and the fourth signal Sp–, such that the second input unit 122 is turned on, that is, the second amplification module 102 in the next stage data receiving circuit 100 receives the third signal Sn– and the fourth signal Sp–.

Case 4: referring to Table 1, when the data signal DQ2 received by the next stage data receiving circuit 100 is at a logic level 1, the data signal DQ2 received by the next stage data receiving circuit 100 and the data signal DQ1 received by the previous stage data receiving circuit 100 have a great level difference, and there is great intersymbol interference.

At this time, the first amplification module 101 in the next stage data receiving circuit 100 performs the second comparison to output the third signal Sn– and the fourth signal Sp–, such that the second input unit 122 is turned on, that is, the second amplification module 102 in the next stage data receiving circuit 100 receives the third signal Sn– and the fourth signal Sp–. At this time, in the next stage data receiving circuit 100, the data signal DQ2 is at a logic level 1, and the voltage difference between the data signal DQ2 and the second reference signal VR– is greater than the voltage difference between the data signal DQ2 and the first reference signal VR+. If the first comparison may be performed at this time, the level difference between the signals in the valid second signal pair obtained by performing the second comparison is greater than the level difference between the signals in the valid first signal pair obtained by performing the first comparison. At this time, the second amplification module 102 receives the valid second signal pair, more facilitating outputting the first output signal Vout and the second output signal VoutN having higher accuracy, to achieve the purpose of reducing the influence of the intersymbol interference of the received data signal DQ on the data receiving circuit 100; and at this time, the first comparison is not performed, which facilitates reducing the power consumption of the data receiving circuit 100.

TABLE 1

| Data signal DQ1 received by a previous stage data transmission circuit | Data signal DQ2 received by a next stage data transmission circuit | First feedback signal fbp received by a next stage data transmission circuit | Second feedback signal fbn received by a next stage data transmission circuit | Signal pair received by a second amplification module in a next stage data transmission circuit |
|---|---|---|---|---|
| 1 | 0 | 1 | 0 | Sn+, Sp+ |
| 1 | 1 | 1 | 0 | Sn+, Sp+ |
| 0 | 0 | 0 | 1 | Sn–, Sp– |
| 0 | 1 | 0 | 1 | Sn–, Sp– |

When the influence of the intersymbol interference on the data receiving circuit 100 does not need to be considered, the enable signal EnDfe is at a low level, and the complementary enable signal EnDfeN is at a high level. At this time, the ninth PMOS transistor MP9 and the eleventh PMOS transistor MP11 are both turned off, the first amplification module 101 regularly performs the first comparison to output the first signal Sn+ and the second signal Sp+, and the first input unit 112 is turned on or off in response to the first signal pair. At this time, the third signal Sn– and the fourth signal Sp– outputted by the second comparison circuit 121 are both logic low-level signals, such that the second input unit 122 in response to the third signal Sn– and the fourth signal Sp– is turned off. It should be noted that, in the above description about the high level and the low level, the high level may be a level greater than or equal to a power supply voltage, and the low level may be a level less than or equal to a ground voltage. Moreover, the high level and the low level are relative, and the specific level range contained in the high level and the low level may be determined according to a specific device. For example, for an NMOS transistor, the high level refers to the level range of a gate voltage that can turn on the NMOS transistor, and the low level refers to the level range of a gate voltage that can turn off the NMOS transistor. For a PMOS transistor, the low level refers to the level range of a gate voltage that can turn on the PMOS transistor, and the high level refers to the level range of a gate voltage that can turn off the PMOS transistor. Furthermore, the high level may be the logic level 1 in the foregoing description, and the low level may be the logic level 0 in the foregoing description.

In conclusion, the first amplification module 101 may be further controlled using the enable signal EnDfe and the feedback signal fb, to select whether to consider the influence of the intersymbol interference of the data received by the data receiving circuit 100 on the data receiving circuit 100. For example, when the influence of the intersymbol interference on the data receiving circuit 100 needs to be reduced, when the enable signal EnDfe is at the first level, the first amplification module 101 selects to perform the first comparison or the second comparison in response to the sampling clock signal clkN and on the basis of the feedback signal fb, such that one of the outputted first signal pair and second signal pair is valid, the other one is invalid, and the signal level difference in the valid signal pair is greater, to ensure that the second amplification module 102 receives the pair of differential signals having a greater signal level difference. When the influence of the intersymbol interference on the data receiving circuit 100 does not need to be considered, when the enable signal EnDfe is at the second level, the first amplification module 101 only performs the first comparison in response to the sampling clock signal clkN to regularly output the valid first signal pair, thereby achieving the effect of reducing the power consumption of the data receiving circuit 100 while improving the receiving performance of the data receiving circuit 100.

Figure 2:
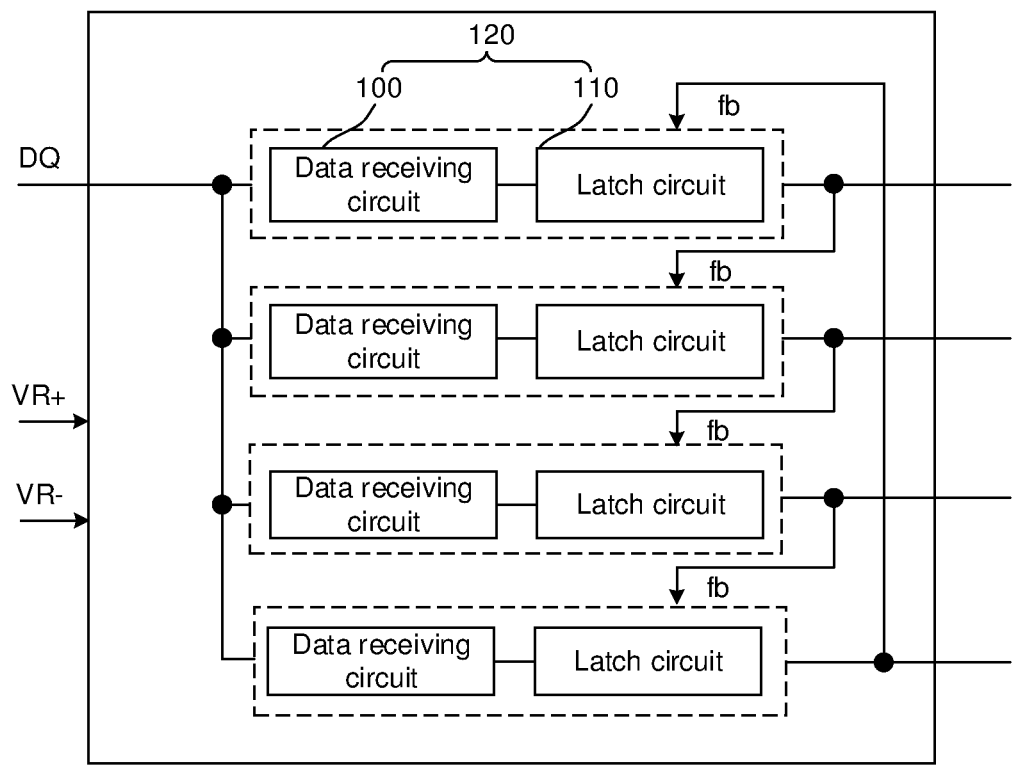
FIG. 2 is a functional block diagram of a data receiving system according to another embodiment of the present disclosure.

Another embodiment of the present disclosure also provides a data receiving system. The data receiving system provided by another embodiment of the present disclosure will be described in detail below with reference to the accompanying drawings. FIG. 2 is a functional block diagram of a data receiving system according to another embodiment of the present disclosure.

Referring to FIG. 2, the data receiving system includes: a plurality of cascaded data transmission circuits 120, where each of the data transmission circuits 120 includes the data receiving circuit 100 as described above, and a latch circuit 110 connected to the data receiving circuit 100; an output signal of a previous stage data transmission circuit 120 is used as the feedback signal fb of a next stage data transmission circuit 120; and an output signal of a last stage data transmission circuit 120 is used as the feedback signal fb of a first stage data transmission circuit 120.

The latch circuits 110 and the data receiving circuits 100 are arranged in one-to-one correspondence, and the latch circuits 110 are configured to latch and output signals outputted by the data receiving circuits 100 corresponding to the latch circuits 110.

In some embodiments, the data receiving circuits 100 receive data in response to sampling clock signals; and the data receiving system includes four cascaded data receiving circuits 100, and the sampling clock signals clkN of the data receiving circuits 100 of adjacent stages have a phase difference of 90 degrees. Thus, the cycle of the sampling clock signals clkN is twice the cycle of the data signals DQ received by data ports, thereby facilitating clock routing and saving of power consumption.

It should be noted that, in FIG. 2, taking an example where the data receiving system includes four cascaded data receiving circuits 100, and the sampling clock signals of the data receiving circuits 100 of adjacent stages have a phase difference of 90 degrees, in practical applications, the number of the cascaded data receiving circuits 100 included in the data receiving system is not limited, and the phase difference of the sampling clock signals of adjacent stages of data receiving circuits 100 may be reasonably set on the basis of the number of the cascaded data receiving circuits 100.

In some embodiments, the first output signal Vout and the second output signal VoutN outputted by the second amplification module 102 of the previous stage data receiving circuit 100 are used as the feedback signal fb of a next stage data receiving circuit. Thus, the output of the data receiving circuit 100 is directly transmitted to the next stage data transmission circuit 120 without passing through the latch circuit 110, thereby facilitating reducing the delay of data transmission. Or, the signal outputted by the previous stage of latch circuit 110 is used as the feedback signal fb of the next stage data receiving circuit 100.

In conclusion, the data receiving system provided by another embodiment of the present disclosure may further control the first amplification module 101 using the enable signal EnDfe and the feedback signal fb, to select whether to consider the influence of the intersymbol interference of the data received by the data receiving circuit 100 on the data receiving circuit 100. For example, when the influence of the intersymbol interference on the data receiving circuit 100 needs to be reduced, when the enable signal EnDfe is at the first level, the first amplification module 101 selects to perform the first comparison or the second comparison in response to the sampling clock signal clkN and on the basis of the feedback signal fb, such that one of the outputted first signal pair and second signal pair is valid, the other one is invalid, and the signal level difference in the valid signal pair is greater, to ensure that the second amplification module 102 receives the pair of differential signals having a greater signal level difference, thereby improving the accuracy of the first output signal Vout and the second output signal VoutN outputted by the second amplification module 102, and facilitating improving the receiving performance of the data receiving system. When the influence of the intersymbol interference on the data receiving circuit 100 does not need to be considered, when the enable signal EnDfe is at the second level, the first amplification module 101 only performs the first comparison in response to the sampling clock signal clkN to regularly output the valid first signal pair, thereby reducing the power consumption of the data receiving system.

Another embodiment of the present disclosure also provides a memory device, including: a plurality of data ports; and a plurality of data receiving systems as described above, each of the data receiving systems corresponding to one of the data ports. Thus, when the influence of the intersymbol interference on the memory device needs to be reduced, each of the data ports in the memory device may flexibly adjust the received data signal DQ through the data receiving system, to improve the adjustability to the first output signal Vout and the second output signal VoutN, thereby improving the receiving performance of the memory device. When the influence of the intersymbol interference on the memory device does not need to be considered, when the enable signal EnDfe is at the second level, the first amplification module 101 only performs the first comparison in response to the sampling clock signal clkN and regularly outputs the valid first signal pair, thereby reducing the power consumption of the memory device.

Those skilled in the art can understand that the above implementations are specific embodiments for implementing the present disclosure. In practical applications, various changes may be made to the above embodiments in terms of form and details without departing from the spirit and scope of the embodiments of the present disclosure. Any person skilled in the art may make changes and modifications to the embodiments without departing from the spirit and scope of the present disclosure. Therefore, the protection scope of the present disclosure should be subject to the scope defined by the claims.

The invention claimed is:

1. A data receiving circuit, comprising:
a first amplification module, configured to: receive an enable signal, a feedback signal, a data signal, a first reference signal, and a second reference signal; when the enable signal is at a first level, in response to a sampling clock signal and on a basis of the feedback signal, select the data signal and the first reference signal for first comparison and output a first signal pair as a result of the first comparison, or select the data signal and the second reference signal for second comparison and output a second signal pair as a result of the second comparison; and when the enable signal is at a second level, perform the first comparison in response to the sampling clock signal, and output the first signal pair; wherein, the first signal pair comprises a first signal and a second signal, and the second signal pair comprises a third signal and a fourth signal; and
a second amplification module, configured to receive output signals of the first amplification module as an input signal pair, perform amplification processing on a voltage difference of the input signal pair, and output a first output signal and a second output signal as a result of the amplification processing; and, wherein the first amplification module comprises:
an amplification unit, provided with a first node, a second node, a third node, and a fourth node respectively configured to output the first signal, the second signal, the third signal, and the fourth signal in response to the sampling clock signal, wherein the amplification unit is configured to receive the data signal, the first reference signal, and the second reference signal; and
a decision equalization enable unit, connected between the first node and the second node as well as between the third node and the fourth node, and configured to: receive the enable signal and the feedback signal; when the enable signal is at the first level, on the basis of the feedback signal, turn on a connection path between the first node and the second node, or turn on a connection path between the third node and the fourth node; and when the enable signal is at the second level, turn off the connection path between the first node and the second node, and turn off the connection path between the third node and the fourth node.

2. The data receiving circuit according to claim 1, wherein the sampling clock signal comprises a first sampling clock signal and a second sampling clock signal; and the amplification unit comprises:
a first comparison circuit, provided with the first node and the second node, and configured to receive the data signal and the first reference signal and perform the first comparison in response to the first sampling clock signal;
a clock generation circuit, configured to receive the enable signal and an original sampling clock signal and output the second sampling clock signal, wherein when the enable signal is at the first level, a phase of the second sampling clock signal is opposite to a phase of the original sampling clock signal, and when the enable signal is at the second level, the second sampling clock signal is a logic high-level signal; and
a second comparison circuit, provided with the third node and the fourth node, and configured to: receive the data signal and the second reference signal; when the enable signal is at the first level, perform the second comparison in response to the second sampling clock signal; and when the enable signal is at the second level, turn on a connection path between the third node and a ground terminal, and turn on a connection path between the fourth node and a ground terminal.

3. The data receiving circuit according to claim 2, wherein the first comparison circuit comprises:
a first current source, connected between a power supply node and a fifth node and configured to provide a current to the fifth node in response to a first sampling clock signal;
a first comparison unit, connected to the first node, the second node, and the fifth node, and configured to receive the data signal and the first reference signal, perform the first comparison when the first current source provides a current to the fifth node, and output the first signal and the second signal; and
a first reset unit, connected to the first node and the second node and configured to reset the first node and the second node in response to the first sampling clock signal; and the second comparison circuit comprises:
a second current source, connected between a power supply node and a sixth node and configured to provide a current to the sixth node in response to a second sampling clock signal;
a second comparison unit, connected to the third node, the fourth node, and the sixth node, and configured to receive the data signal and the second reference signal, perform the second comparison when the second current source provides a current to the sixth node, and output the third signal and the fourth signal; and
a second reset unit, connected between the third node and the fourth node and configured to reset the third node and the fourth node in response to the second sampling clock signal.

4. The data receiving circuit according to claim 3, wherein the first current source comprises:
a first positive-channel metal-oxide semiconductor (PMOS) transistor, connected between the power supply node and the fifth node and provided with a gate for receiving the first sampling clock signal; and
the second current source comprises:
a second PMOS transistor, connected between the power supply node and the sixth node and provided with a gate for receiving the second sampling clock signal.

5. The data receiving circuit according to claim 3, wherein the first comparison unit comprises:
a third positive-channel metal-oxide semiconductor (PMOS) transistor, connected between the first node and the fifth node and provided with a gate for receiving the data signal; and
a fourth PMOS transistor, connected between the second node and the fifth node and provided with a gate for receiving the first reference signal; and
the second comparison unit comprises:
a fifth PMOS transistor, connected between the third node and the sixth node and provided with a gate for receiving the data signal; and
a sixth PMOS transistor, connected between the fourth node and the sixth node and provided with a gate for receiving the second reference signal.

6. The data receiving circuit according to claim 3, wherein the first reset unit comprises:
- a first negative-channel metal-oxide semiconductor (NMOS) transistor, connected between the first node and a ground terminal and provided with a gate for receiving the first sampling clock signal; and
- a second NMOS transistor, connected between the second node and the ground terminal and provided with a gate for receiving the first sampling clock signal; and the second reset unit comprises:
- a third NMOS transistor, connected between the third node and a ground terminal and provided with a gate for receiving the second sampling clock signal; and
- a fourth NMOS transistor, connected between the fourth node and the ground terminal and provided with a gate for receiving the second sampling clock signal.

7. The data receiving circuit according to claim 2, wherein the clock generation circuit comprises:
- a first NAND gate circuit, provided with one input terminal for receiving the original sampling clock signal, the other input terminal connected to a power supply node, and an output terminal for outputting the first sampling clock signal; and
- a second NAND gate circuit, provided with one input terminal for receiving the original sampling clock signal, the other input terminal for receiving the enable signal, and an output terminal for outputting the second sampling clock signal.

8. The data receiving circuit according to claim 1, wherein the feedback signal comprises a first feedback signal and a second feedback signal differential to each other; and the decision equalization enable unit comprises:
- a first enable unit, configured to be turned on in response to the enable signal and the first feedback signal, to connect the first node and the second node; and
- a second enable unit, configured to be turned on in response to the enable signal and the second feedback signal, to connect the third node and the fourth node;
- wherein, when the enable signal is at the first level, the first enable unit or the second enable unit is turned on, and when the enable signal is at the second level, the first enable unit and the second enable unit are both turned off.

9. The data receiving circuit according to claim 8, wherein the first enable unit comprises:
- a ninth positive-channel metal-oxide semiconductor (PMOS) transistor and a tenth PMOS transistor, the ninth PMOS transistor being provided with one end connected to the first node, a gate for receiving a complementary enable signal, and the other end connected to one end of the tenth PMOS transistor, the tenth PMOS transistor being provided with the other end connected to the second node and a gate for receiving the first feedback signal, and a level of the complementary enable signal being opposite to a level of the enable signal.

10. The data receiving circuit according to claim 9, wherein the first enable unit further comprises:
- a ninth negative-channel metal-oxide semiconductor (NMOS) transistor and a tenth NMOS transistor, the ninth NMOS transistor being provided with one end connected to the first node, a gate for receiving the enable signal, and the other end connected to one end of the tenth NMOS transistor, the tenth NMOS transistor being provided with the other end connected to the second node and a gate for receiving a first complementary feedback signal, and a level of the first complementary feedback signal being opposite to a level of the first feedback signal.

11. The data receiving circuit according to claim 8, wherein the second enable unit comprises:
- an eleventh positive-channel metal-oxide semiconductor (PMOS) transistor and a twelfth PMOS transistor, the eleventh PMOS transistor being provided with one end connected to the third node, a gate for receiving a complementary enable signal, and the other end connected to one end of the twelfth PMOS transistor, the twelfth PMOS transistor being provided with the other end connected to the fourth node and a gate for receiving the second feedback signal, and a level of the complementary enable signal being opposite to a level of the enable signal.

12. The data receiving circuit according to claim 11, wherein the second enable unit further comprises:
- an eleventh negative-channel metal-oxide semiconductor (NMOS) transistor and a twelfth NMOS transistor, the eleventh NMOS transistor being provided with one end connected to the third node, a gate for receiving the enable signal, and the other end connected to one end of the twelfth NMOS transistor, the twelfth NMOS transistor being provided with the other end connected to the fourth node and a gate for receiving a second complementary feedback signal, and a level of the second complementary feedback signal being opposite to a level of the second feedback signal.

13. The data receiving circuit according to claim 1, wherein the second amplification module comprises:
- a first input unit, connected to a seventh node and an eighth node, and configured to receive the first signal pair for third comparison and provide signals to the seventh node and the eighth node, respectively, as a result of the third comparison;
- a second input unit, connected to the seventh node and the eighth node, and configured to receive the second signal pair for fourth comparison and provide signals to the seventh node and the eighth node, respectively, as a result of the fourth comparison; and
- a latch unit, connected to the seventh node and the eighth node, and configured to amplify and latch a signal of the seventh node and a signal of the eighth node, and output the first output signal and the second output signal respectively through a first output node and a second output node.

14. The data receiving circuit according to claim 13, wherein the first input unit comprises:
- a fifth negative-channel metal-oxide semiconductor (NMOS) transistor, provided with a drain connected to the seventh node, a source connected to a ground terminal, and a gate for receiving the first signal; and
- a sixth NMOS transistor, provided with a drain connected to the eighth node, a source connected to a ground terminal, and a gate for receiving the second signal; and the second input unit comprises:
- a seventh NMOS transistor, provided with a drain connected to the seventh node, a source connected to a ground terminal, and a gate for receiving the third signal; and
- an eighth NMOS transistor, provided with a drain connected to the eighth node, a source connected to a ground terminal, and a gate for receiving the fourth signal.

15. The data receiving circuit according to claim 13, wherein the latch unit comprises:

a thirteenth negative-channel metal-oxide semiconductor (NMOS) transistor and a seventh positive-channel metal-oxide semiconductor (PMOS) transistor, a gate of the thirteenth NMOS transistor and a gate of the seventh PMOS transistor being both connected to the second output node, a source of the thirteenth NMOS transistor being connected to the seventh node, a drain of the thirteenth NMOS transistor and a drain of the seventh PMOS transistor being both connected to the first output node, and a source of the seventh PMOS transistor being connected to a power supply node; and
a fourteenth NMOS transistor and an eighth PMOS transistor, a gate of the fourteenth NMOS transistor and a gate of the eighth PMOS transistor being both connected to the first output node, a source of the fourteenth NMOS transistor being connected to the eighth node, a drain of the fourteenth NMOS transistor and a drain of the eighth PMOS transistor being both connected to the second output node, and a source of the eighth PMOS transistor being connected to the power supply node.

16. The data receiving circuit according to claim 15, wherein the second amplification module further comprises:
a third reset unit, connected between the power supply node and an output terminal of the latch unit and configured to reset the output terminal of the latch unit;
wherein the third reset unit comprises:
a thirteenth PMOS transistor, connected between the first output node and the power supply node and provided with a gate for receiving an original sampling clock signal; and
a fourteenth PMOS transistor, connected between the second output node and the power supply node and provided with a gate for receiving the original sampling clock signal.

17. A data receiving system, comprising:
a plurality of cascaded data transmission circuits, wherein each of the data transmission circuits comprises a data receiving circuit, and a latch circuit connected to the data receiving circuit;
an output signal of a previous stage data transmission circuit is used as the feedback signal of a next stage data transmission circuit; and
an output signal of a last stage data transmission circuit is used as the feedback signal of a first stage data transmission circuit; and,
wherein the data receiving circuit comprises:
a first amplification module, configured to: receive an enable signal, a feedback signal, a data signal, a first reference signal, and a second reference signal; when the enable signal is at a first level, in response to a sampling clock signal and on a basis of the feedback signal, select the data signal and the first reference signal for first comparison and output a first signal pair as a result of the first comparison, or select the data signal and the second reference signal for second comparison and output a second signal pair as a result of the second comparison; and when the enable signal is at a second level, perform the first comparison in response to the sampling clock signal, and output the first signal pair; wherein, the first signal pair comprises a first signal and a second signal, and the second signal pair comprises a third signal and a fourth signal; and
a second amplification module, configured to receive output signals of the first amplification module as an input signal pair, perform amplification processing on a voltage difference of the input signal pair, and output a first output signal and a second output signal as a result of the amplification processing;
wherein the first amplification module comprises:
an amplification unit, provided with a first node, a second node, a third node, and a fourth node respectively configured to output the first signal, the second signal, the third signal, and the fourth signal in response to the sampling clock signal, wherein the amplification unit is configured to receive the data signal, the first reference signal, and the second reference signal; and
a decision equalization enable unit, connected between the first node and the second node as well as between the third node and the fourth node, and configured to: receive the enable signal and the feedback signal; when the enable signal is at the first level, on the basis of the feedback signal, turn on a connection path between the first node and the second node, or turn on a connection path between the third node and the fourth node; and when the enable signal is at the second level, turn off the connection path between the first node and the second node, and turn off the connection path between the third node and the fourth node.

18. The data receiving system according to claim 17, wherein the data receiving circuit receives data in response to a sampling clock signal; and the data receiving system comprises four cascaded data transmission circuits, and the sampling clock signals of the data receiving circuits of adjacent stages have a phase difference of 90 degrees;
wherein the first output signal and the second output signal outputted by the second amplification module of a previous stage data receiving circuit are used as the feedback signal of a next stage data receiving circuit; or, a signal outputted by a previous stage of the latch circuit is used as the feedback signal of a next stage data receiving circuit.

19. A memory device, comprising:
a plurality of data ports; and
a plurality of data receiving systems, each of the data receiving systems corresponding to one of the data ports;
wherein each of the data receiving systems comprises:
a plurality of cascaded data transmission circuits, wherein each of the data transmission circuits comprises a data receiving circuit, and a latch circuit connected to the data receiving circuit;
an output signal of a previous stage data transmission circuit is used as the feedback signal of a next stage data transmission circuit; and
an output signal of a last stage data transmission circuit is used as the feedback signal of a first stage data transmission circuit;
wherein the data receiving circuit comprises:
a first amplification module, configured to: receive an enable signal, a feedback signal, a data signal, a first reference signal, and a second reference signal; when the enable signal is at a first level, in response to a sampling clock signal and on a basis of the feedback signal, select the data signal and the first reference signal for first comparison and output a first signal pair as a result of the first comparison, or select the data signal and the second reference signal for second comparison and output a second signal pair as a result of the second comparison; and when the enable signal is at a second level, perform the first comparison in response to the sampling clock signal, and output the first signal pair; wherein, the first signal pair comprises a first signal and a second signal, and the second signal pair comprises a third signal and a fourth signal; and a second amplification module, configured to receive output signals of the first amplification module as an input signal pair, perform amplification processing on a voltage difference of the input signal pair, and output a first output signal and a second output signal as a result of the amplification processing;

wherein the first amplification module comprises:

an amplification unit, provided with a first node, a second node, a third node, and a fourth node respectively configured to output the first signal, the second signal, the third signal, and the fourth signal in response to the sampling clock signal, wherein the amplification unit is configured to receive the data signal, the first reference signal, and the second reference signal; and a decision equalization enable unit, connected between the first node and the second node as well as between the third node and the fourth node, and configured to: receive the enable signal and the feedback signal; when the enable signal is at the first level, on the basis of the feedback signal, turn on a connection path between the first node and the second node, or turn on a connection path between the third node and the fourth node; and when the enable signal is at the second level, turn off the connection path between the first node and the second node, and turn off the connection path between the third node and the fourth node.

* * * * *